(12) United States Patent
Biskeborn et al.

(10) Patent No.: US 10,839,837 B2
(45) Date of Patent: Nov. 17, 2020

(54) DETERMINING SPAN EXPANSION OR CONTRACTION BETWEEN FEATURES AND STRUCTURES IN THIN FILMS

(71) Applicant: International Business Machines Corporation, Armonk, NY (US)

(72) Inventors: Robert G. Biskeborn, Hollister, CA (US); Jason Liang, Campbell, CA (US); Calvin S. Lo, Saratoga, CA (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 15/986,674

(22) Filed: May 22, 2018

(65) Prior Publication Data

US 2019/0362750 A1 Nov. 28, 2019

(51) Int. Cl.
| | |
|---|---|
| *G11B 5/55* | (2006.01) |
| *G03F 7/20* | (2006.01) |
| *H04N 13/246* | (2018.01) |
| *G01D 5/347* | (2006.01) |
| *G01D 5/245* | (2006.01) |

(52) U.S. Cl.
CPC ......... *G11B 5/5504* (2013.01); *G01D 5/2455* (2013.01); *G01D 5/34776* (2013.01); *G03F 7/70616* (2013.01); *H04N 13/246* (2018.05)

(58) Field of Classification Search
CPC .................................................. G11B 5/5504
USPC ........................................................ 360/121
See application file for complete search history.

(56) References Cited

U.S. PATENT DOCUMENTS

| | | | |
|---|---|---|---|
| 5,870,197 A | * | 2/1999 | Sogard ................ G03F 7/70716 355/30 |
| 6,481,003 B1 | | 11/2002 | Maeda |
| 6,867,412 B2 | | 3/2005 | Patzwald et al. |
| 7,274,471 B2 | | 9/2007 | Shin et al. |
| 8,654,195 B2 | | 2/2014 | Ishiyama et al. |
| 8,989,511 B1 | * | 3/2015 | Leary ...................... G06T 5/006 382/256 |
| 9,159,119 B2 | | 10/2015 | Shechtman et al. |
| 9,265,414 B2 | | 2/2016 | Wilson et al. |

(Continued)

FOREIGN PATENT DOCUMENTS

KR 20070117937 A 12/2007

OTHER PUBLICATIONS

Biskeborn, R.G., U.S. Appl. No. 15/936,171, filed Mar. 26, 2018.

*Primary Examiner* — Allen T Cao
(74) *Attorney, Agent, or Firm* — Zilka-Kotab, P.C.

(57) ABSTRACT

A method for measuring a distance between features of a sample, according to one embodiment, includes moving a precision stage having the sample thereon for positioning a first feature of the sample in a field of view of an imaging device. The imaging device is instructed to generate a first image of the first feature of the sample. The sample is moved a defined distance using the precision stage. The imaging device is instructed to generate a second image of a second feature of the sample at the defined distance. The first image and the second image are used to determine an actual distance between the first feature and the second feature. A product, according to one embodiment, includes a thin film structure having a plurality of elements, and at least two features dedicated for enabling measurement therebetween. Each feature is positioned at a known position relative to a respective one of the elements.

19 Claims, 14 Drawing Sheets

(56) References Cited

U.S. PATENT DOCUMENTS

| | | | | |
|---|---|---|---|---|
| 2002/0150308 A1* | 10/2002 | Nakamura | ......... | G06K 9/00201 |
| | | | | 382/286 |
| 2011/0038527 A1* | 2/2011 | Liu | ...................... | G06K 9/6203 |
| | | | | 382/145 |
| 2012/0082343 A1* | 4/2012 | Schoeberl | ............ | H04N 19/172 |
| | | | | 382/103 |
| 2012/0177268 A1* | 7/2012 | Malmin | ................ | G06T 11/005 |
| | | | | 382/131 |
| 2012/0263347 A1* | 10/2012 | Ichimaru | ................ | G01B 11/25 |
| | | | | 382/103 |
| 2015/0199818 A1* | 7/2015 | Einecke | ............. | G06K 9/00791 |
| | | | | 382/104 |
| 2018/0299645 A1* | 10/2018 | Kuribayashi | ............ | G02B 7/04 |
| 2019/0080471 A1* | 3/2019 | Tsuda | ........................ | G06T 7/74 |

\* cited by examiner

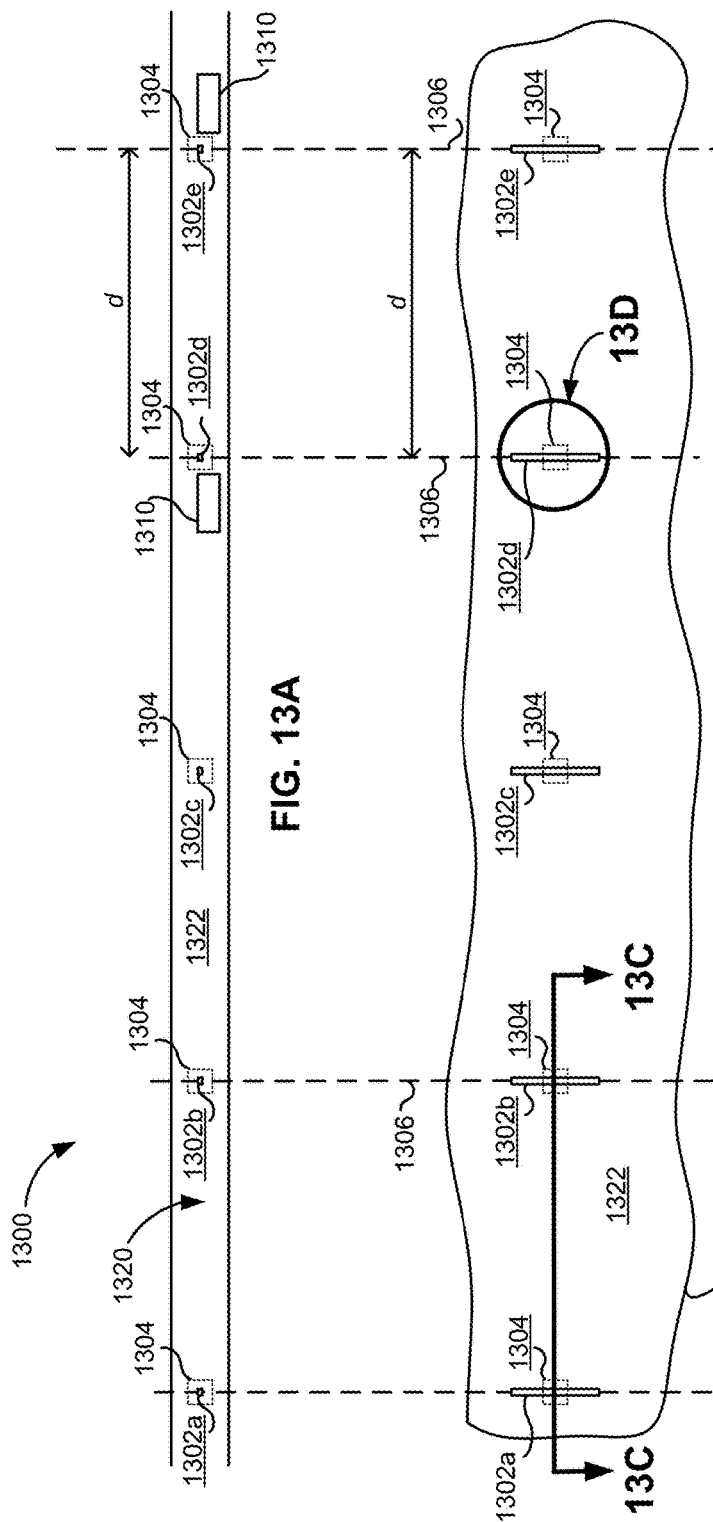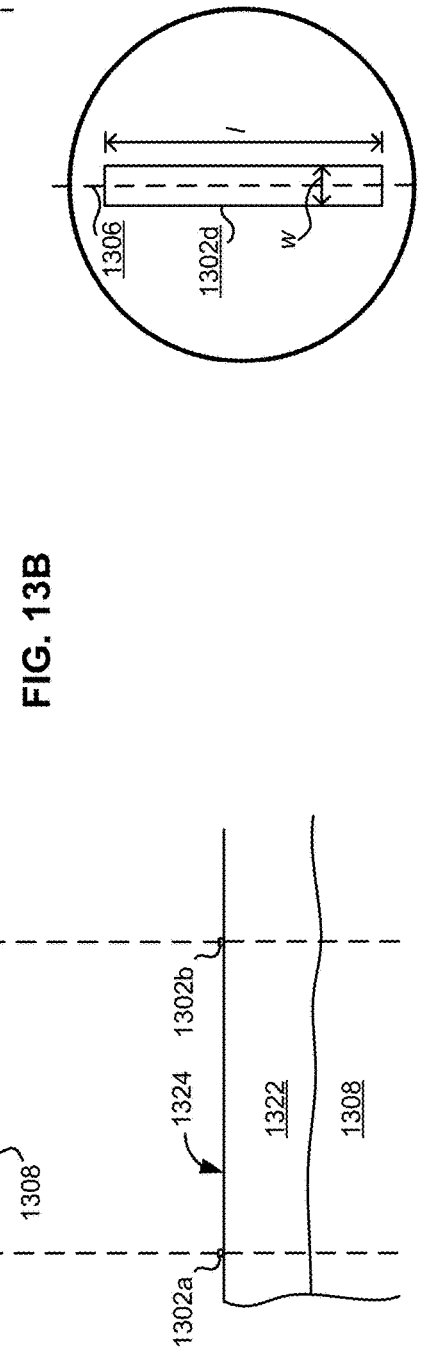

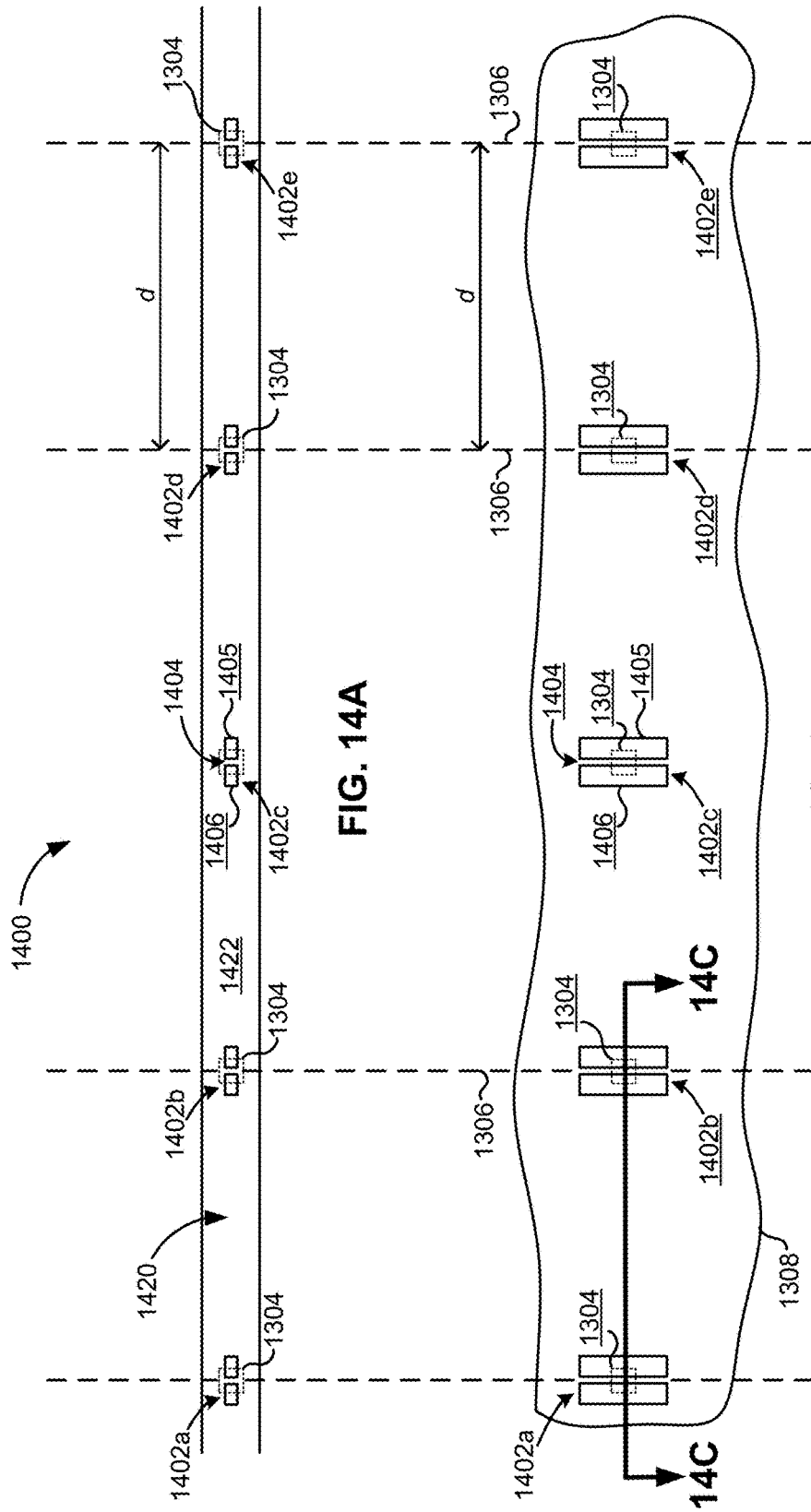

DETERMINING SPAN EXPANSION OR CONTRACTION BETWEEN FEATURES AND STRUCTURES IN THIN FILMS

BACKGROUND

The present invention relates to data storage systems, and more particularly, this invention relates to structure for measuring span expansion or contraction in thin films, and methods thereof.

In magnetic storage systems, magnetic transducers read data from and write data onto magnetic recording media. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has led to increasing the track and linear bit density on recording tape, and decreasing the thickness of the magnetic tape medium. However, the development of small footprint, higher performance tape drive systems has created various problems in the design of a tape head assembly for use in such systems. One such problem is variation in transducer span distance from design specifications. Such variations are particularly problematic when servo reader pitch varies significantly from design specifications.

In a tape drive system, the drive moves the magnetic tape over the surface of the tape head at high speed. Usually the tape head is designed to minimize the spacing between the head and the tape. The spacing between the magnetic head and the magnetic tape is crucial and so goals in these systems are to have the recording gaps of the transducers, which are the source of the magnetic recording flux in near contact with the tape to effect writing sharp transitions, and to have the read elements in near contact with the tape to provide effective coupling of the magnetic field from the tape to the read elements.

SUMMARY

A method for measuring a distance between features of a sample, according to one embodiment, includes moving a precision stage having the sample thereon for positioning a first feature of the sample in a field of view of an imaging device. The imaging device is instructed to generate a first image of the first feature of the sample. The sample is moved a defined distance using the precision stage. The imaging device is instructed to generate a second image of a second feature of the sample at the defined distance. The first image and the second image are used to determine an actual distance between the first feature and the second feature.

A product, according to one embodiment, includes a thin film structure having a plurality of elements, and at least two features dedicated for enabling measurement therebetween. Each feature is positioned at a known position relative to a respective one of the elements.

A computer program product comprising a computer readable storage medium having program instructions embodied therewith. The computer readable storage medium is not a transitory signal per se. The program instructions are readable and/or executable by a processor to cause the processor to perform the foregoing method.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIGS. 13A-13D depicts various embodiments of a product having features that enable measuring of the span between features.

FIGS. 14A-14C depict a product having dedicated features for enabling measurement of a span between the features, in accordance with various embodiments.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof.

In one general embodiment, a method for measuring a distance between features of a sample includes moving a precision stage having the sample thereon for positioning a first feature of the sample in a field of view of an imaging device. The imaging device is instructed to generate a first image of the first feature of the sample. The sample is moved a defined distance using the precision stage. The imaging device is instructed to generate a second image of a second feature of the sample at the defined distance. The first image and the second image are used to determine an actual distance between the first feature and the second feature.

In another general embodiment, a product includes a thin film structure having a plurality of elements, and at least two features dedicated for enabling measurement therebetween. Each feature is positioned at a known position relative to a respective one of the elements.

In yet another general embodiment, a computer program product includes a computer readable storage medium having program instructions embodied therewith. The computer readable storage medium is not a transitory signal per se. The program instructions are readable and/or executable by a processor to cause the processor to perform the foregoing method.

Figure 1A:
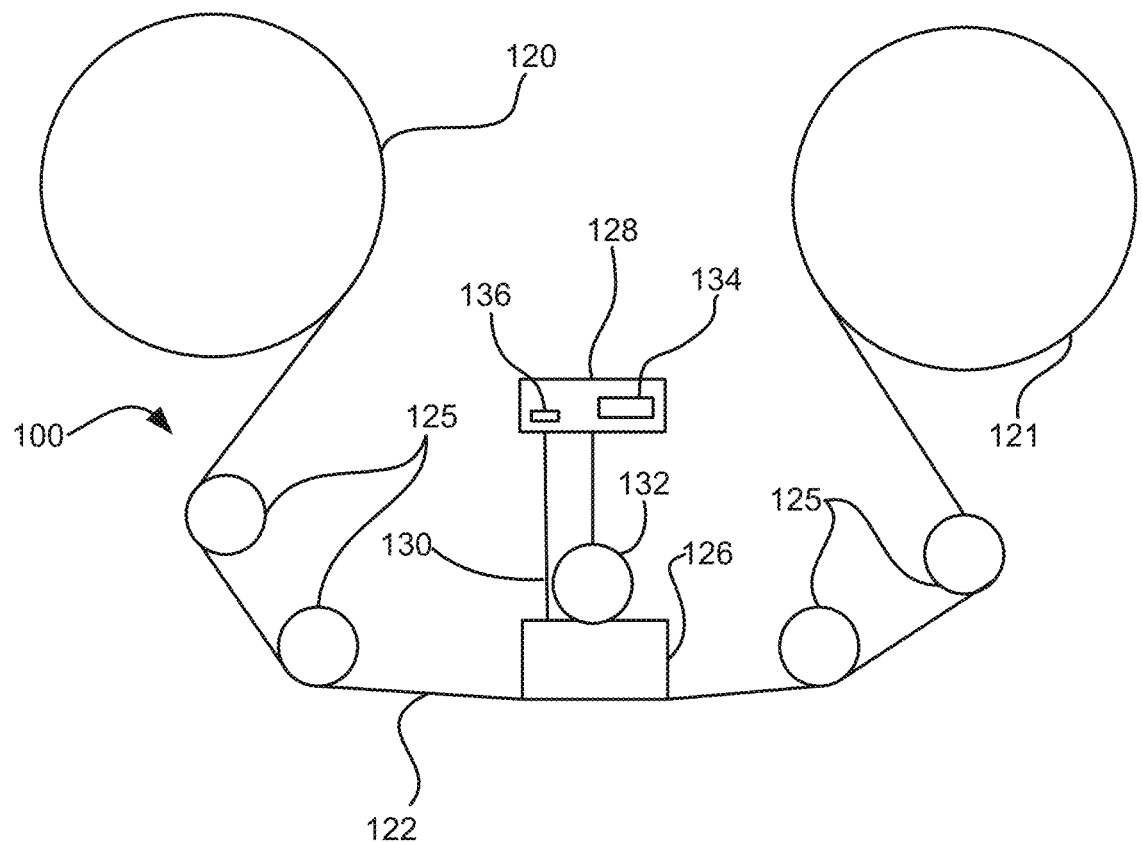
FIG. 1A is a schematic diagram of a simplified tape drive system according to one embodiment.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the system 100. The tape drive, such as that illustrated in FIG. 1A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 1B:
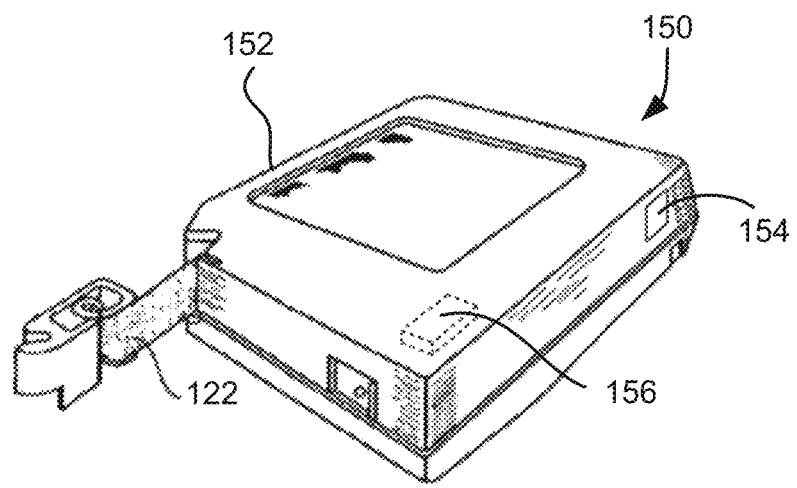
FIG. 1B is a schematic diagram of a tape cartridge according to one embodiment.

FIG. 1B illustrates an exemplary tape cartridge 150 according to one embodiment. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 1B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, read-only memory (ROM) device, etc., embedded into or coupled to the inside or outside of the tape cartridge 150. The nonvolatile memory is accessible by the tape drive and the tape operating software (the driver software), and/or another device.

Figure 2A:
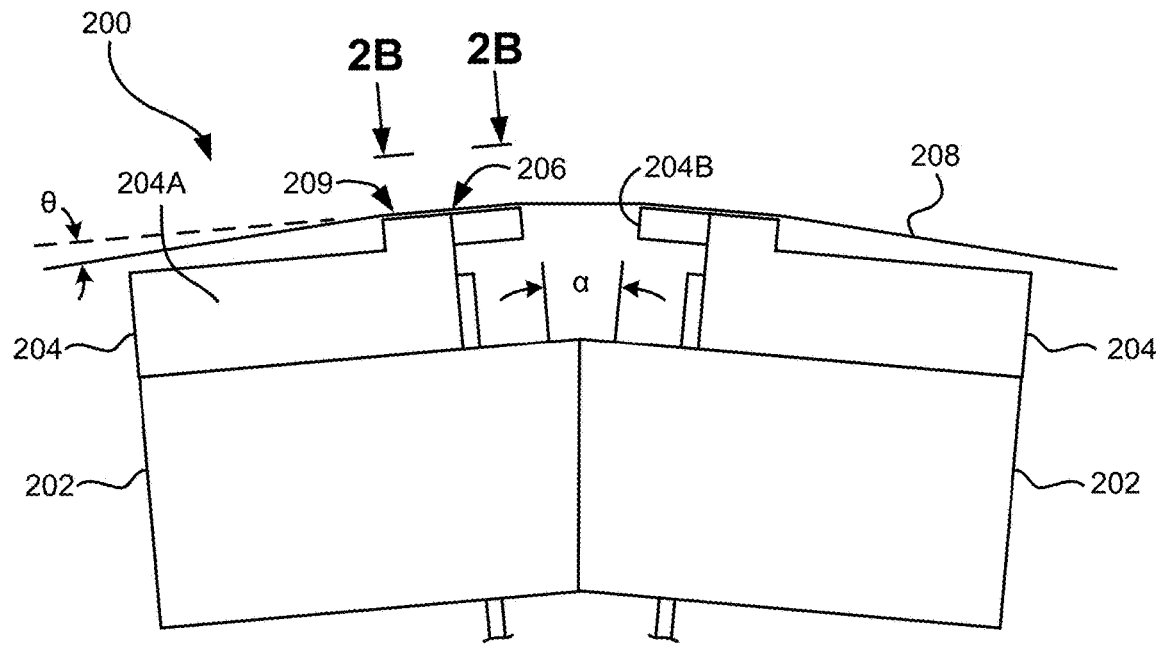
FIG. 2A illustrates a side view of a flat-lapped, bi-directional, two-module magnetic tape head according to one embodiment.

By way of example, FIG. 2A illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between about 0.1 degree and about 3 degrees.

The substrates 204A are typically constructed of a wear resistant material, such as a ceramic. The closures 204B may be made of the same or similar ceramic as the substrates 204A.

The readers and writers may be arranged in a piggyback or merged configuration. An illustrative piggybacked configuration comprises a (magnetically inductive) writer transducer on top of (or below) a (magnetically shielded) reader transducer (e.g., a magnetoresistive reader, etc.), wherein the poles of the writer and the shields of the reader are generally separated. An illustrative merged configuration comprises one reader shield in the same physical layer as one writer pole (hence, "merged"). The readers and writers may also be arranged in an interleaved configuration. Alternatively, each array of channels may be readers or writers only. Any of these arrays may contain one or more servo track readers for reading servo data on the medium.

Figure 2B:
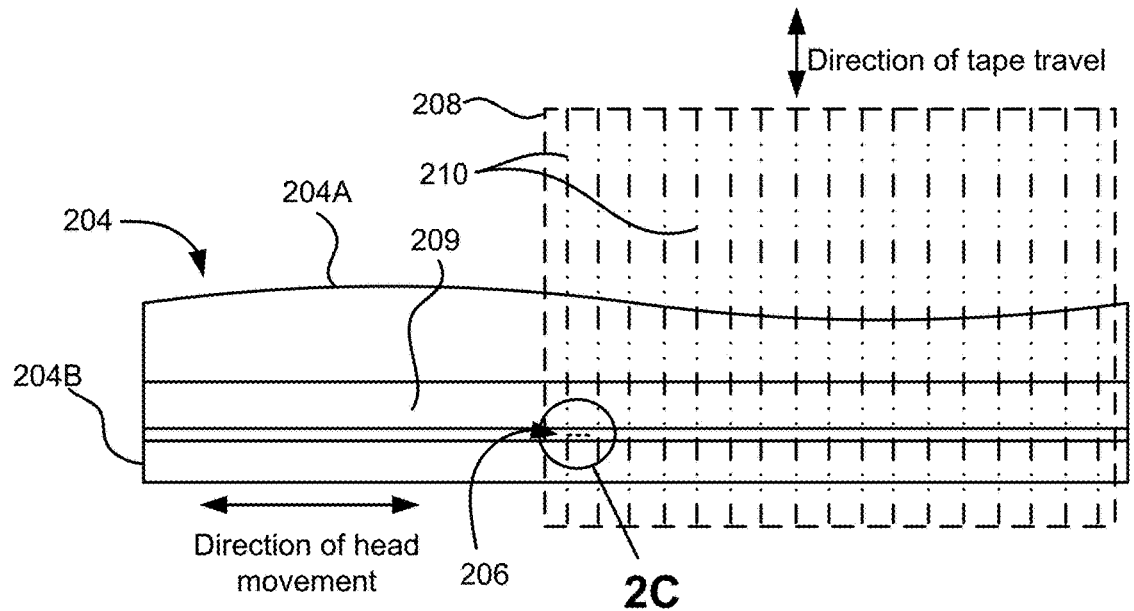
FIG. 2B is a tape bearing surface view taken from Line 2B of FIG. 2A.

FIG. 2B illustrates the tape bearing surface 209 of one of the modules 204 taken from Line 2B of FIG. 2A. A representative tape 208 is shown in dashed lines. The module 204 is preferably long enough to be able to support the tape as the head steps between data bands.

In this example, the tape 208 includes 4 to 32 data bands, e.g., with 16 data bands and 17 servo tracks 210, as shown in FIG. 2B on a one-half inch wide tape 208. The data bands are defined between servo tracks 210. Each data band may include a number of data tracks, for example 1024 data tracks (not shown). During read/write operations, the readers and/or writers 206 are positioned to specific track positions within one of the data bands. Outer readers, sometimes called servo readers, read the servo tracks 210. The servo signals are in turn used to keep the readers and/or writers 206 aligned with a particular set of tracks during the read/write operations.

Figure 2C:
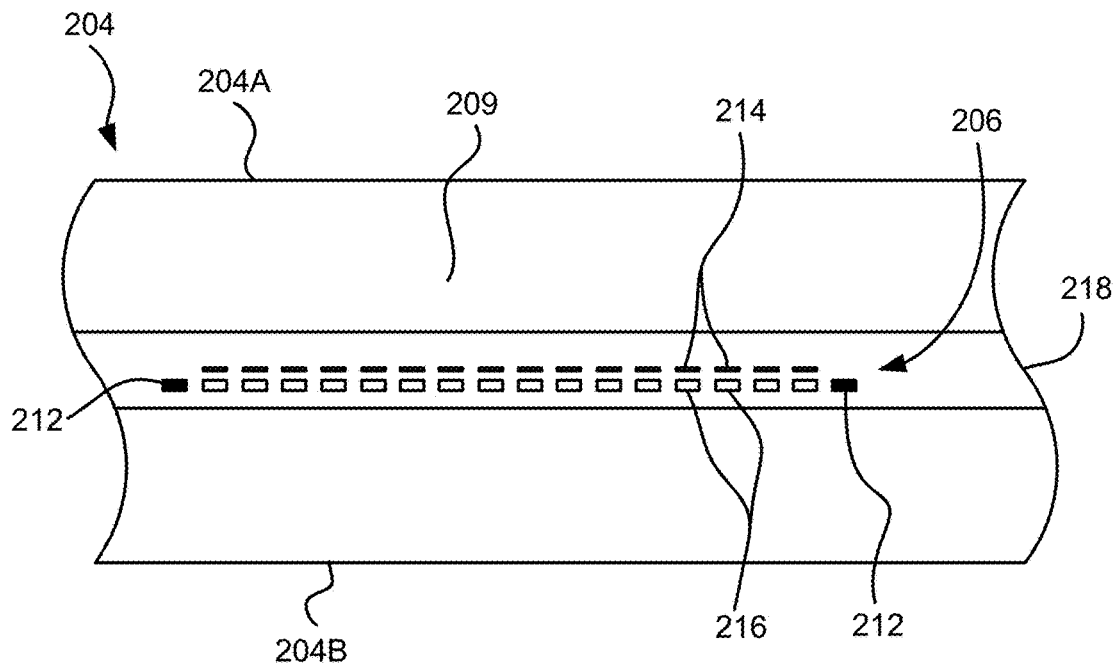
FIG. 2C is a detailed view taken from Circle 2C of FIG. 2B.

FIG. 2C depicts a plurality of readers and/or writers 206 formed in a gap 218 on the module 204 in Circle 2C of FIG. 2B. As shown, the array of readers and writers 206 includes, for example, 16 writers 214, 16 readers 216 and two servo readers 212, though the number of elements may vary. Illustrative embodiments include 8, 16, 32, 40, and 64 active readers and/or writers 206 per array, and alternatively interleaved designs having odd numbers of reader or writers such as 17, 25, 33, etc. An illustrative embodiment includes 32 readers per array and/or 32 writers per array, where the actual number of transducer elements could be greater, e.g., 33, 34, etc. This allows the tape to travel more slowly thereby reducing speed-induced tracking and mechanical difficulties and/or execute fewer "wraps" to fill or read the tape. While the readers and writers may be arranged in a piggyback configuration as shown in FIG. 2C, the readers 216 and writers 214 may also be arranged in an interleaved configuration. Alternatively, each array of readers and/or writers 206 may be readers or writers only, and the arrays may contain one or more servo readers 212. As noted by considering FIGS. 2A and 2B-2C together, each module 204 may include a complementary set of readers and/or writers 206 for such things as bi-directional reading and writing, read-while-write capability, backward compatibility, etc.

Figure 2D:
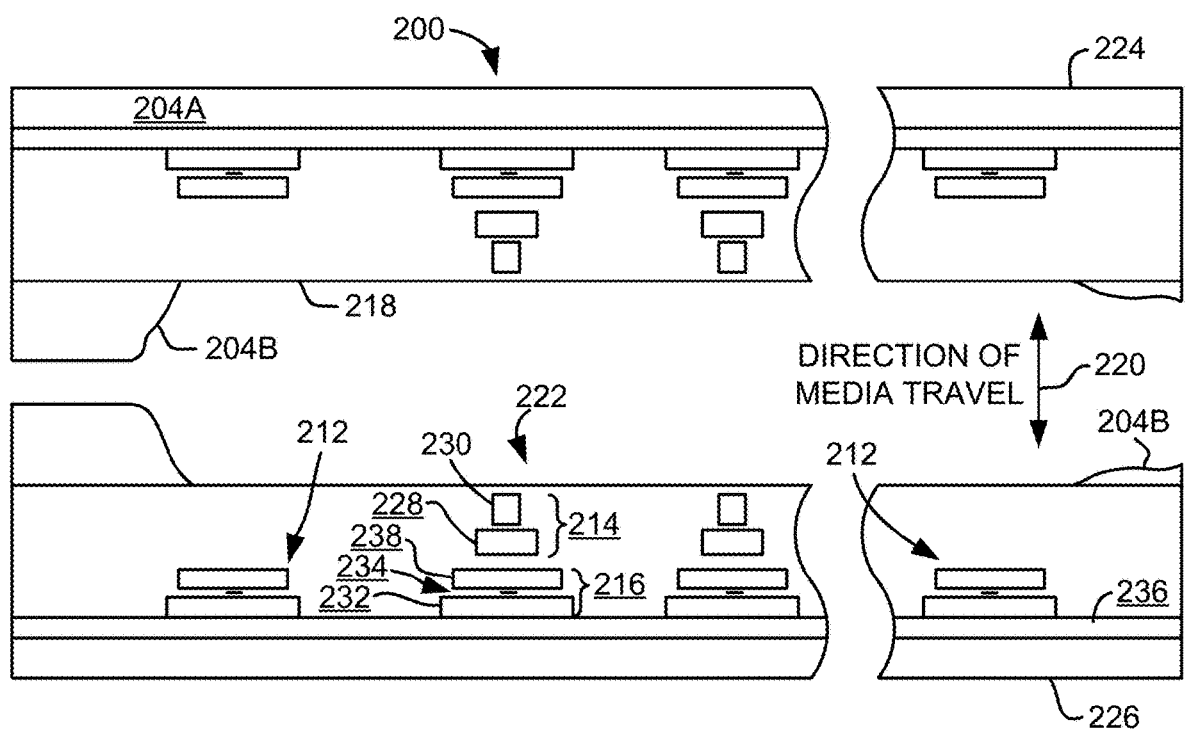
FIG. 2D is a detailed view of a partial tape bearing surface of a pair of modules.

FIG. 2D shows a partial tape bearing surface view of complementary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write transducer 214 and the readers, exemplified by the read transducer 216, are aligned parallel to an intended direction of travel of a tape medium thereacross to form an R/W pair, exemplified by the R/W pair 222. Note that the intended direction of tape travel is sometimes referred to herein as the direction of tape travel, and such terms may be used interchangeably. Such direction of tape travel may be inferred from the design of the system, e.g., by examining the guides; observing the actual direction of tape travel relative to the reference point; etc. Moreover, in a system operable for bi-direction reading and/or writing, the direction of tape travel in both directions is typically parallel and thus both directions may be considered equivalent to each other.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked magnetoresistive (MR) head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (–), cobalt zirconium tantalum (CZT) or Al—Fe—Si (Sendust), a sensor 234 for sensing a data track on a magnetic medium, a second shield 238 typically of a nickel-iron alloy (e.g., ~80/20 at % NiFe, also known as permalloy), first and second writer pole tips 228, 230, and a coil (not shown). The sensor may be of any known type, including those based on MR, GMR, AMR, tunneling magnetoresistance (TMR), etc.

The first and second writer poles 228, 230 may be fabricated from high magnetic moment materials such as ~45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Figure 4:
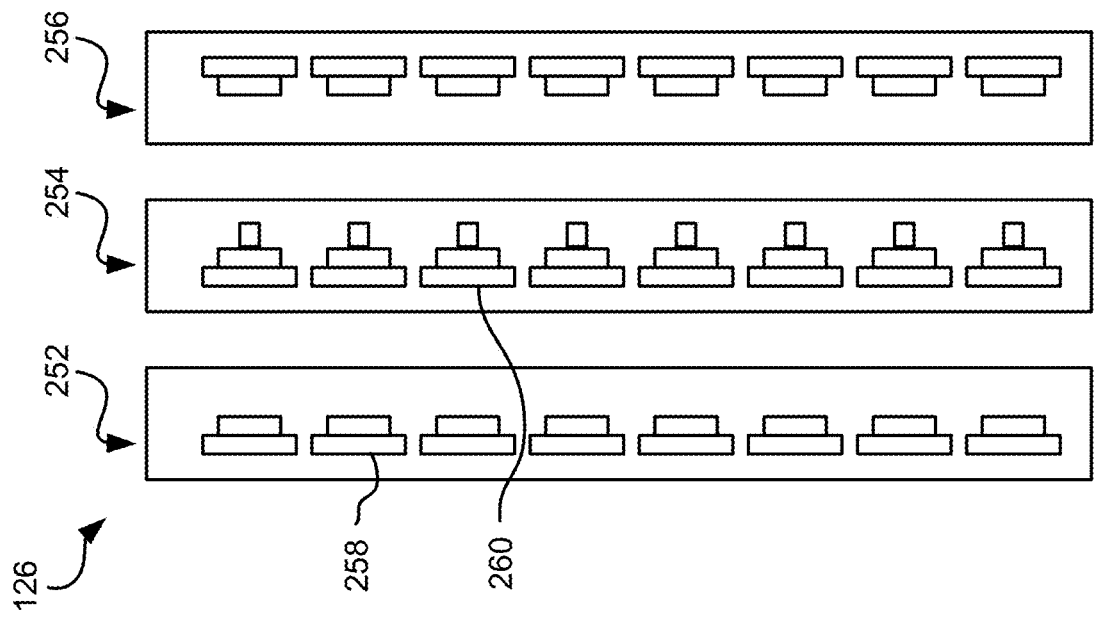
FIG. 4 is a partial tape bearing surface view of a magnetic head having a read-write-read configuration.
Figure 3:
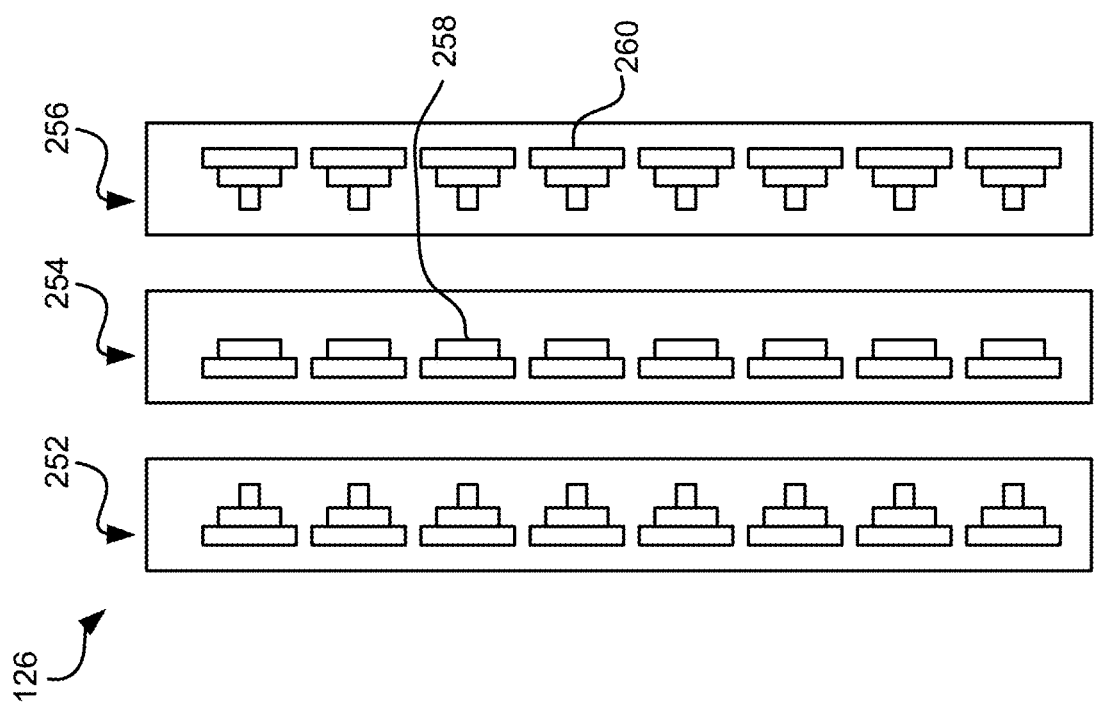
FIG. 3 is a partial tape bearing surface view of a magnetic head having a write-read-write configuration.

The configuration of the tape head 126 according to one embodiment includes multiple modules, preferably three or more. In a write-read-write (W-R-W) head, outer modules for writing flank one or more inner modules for reading. Referring to FIG. 3, depicting a W-R-W configuration, the outer modules 252, 256 each include one or more arrays of writers 260. The inner module 254 of FIG. 3 includes one or more arrays of readers 258 in a similar configuration. Variations of a multi-module head include a R-W-R head (FIG. 4), a R-R-W head, a W-W-R head, etc. In yet other variations, one or more of the modules may have read/write pairs of transducers. Moreover, more than three modules may be present. In further approaches, two outer modules may flank two or more inner modules, e.g., in a W-R-R-W, a R-W-W-R arrangement, etc. For simplicity, a W-R-W head is used primarily herein to exemplify embodiments of the present invention. One skilled in the art apprised with the teachings herein will appreciate how permutations of the present invention would apply to configurations other than a W-R-W configuration.

Figure 5:
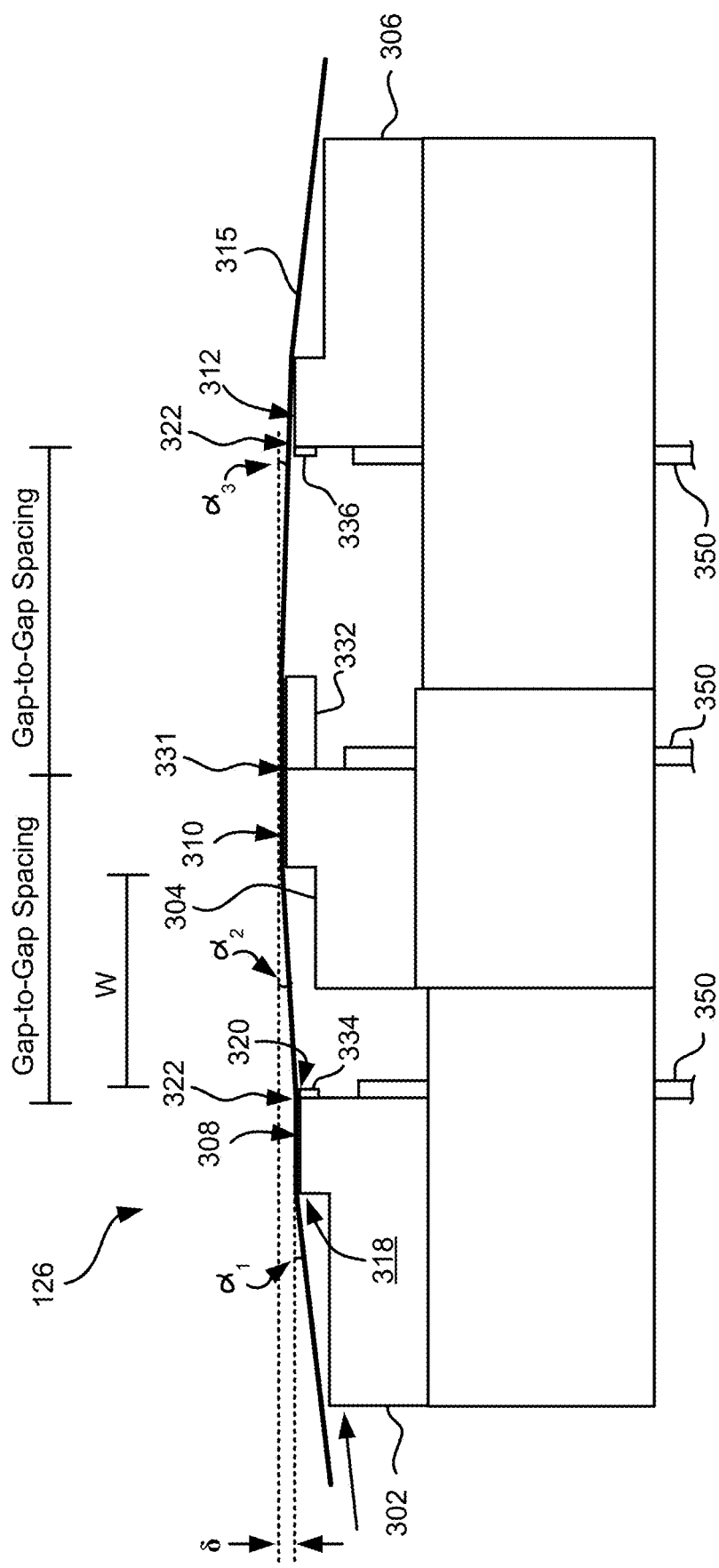
FIG. 5 is a side view of a magnetic tape head with three modules according to one embodiment where the modules all generally lie along about parallel planes.

FIG. 5 illustrates a magnetic head 126 according to one embodiment of the present invention that includes first, second and third modules 302, 304, 306 each having a tape bearing surface 308, 310, 312 respectively, which may be flat, contoured, etc. Note that while the term "tape bearing surface" appears to imply that the surface facing the tape 315 is in physical contact with the tape bearing surface, this is not necessarily the case. Rather, only a portion of the tape may be in contact with the tape bearing surface, constantly or intermittently, with other portions of the tape riding (or "flying") above the tape bearing surface on a layer of air, sometimes referred to as an "air bearing". The first module 302 will be referred to as the "leading" module as it is the first module encountered by the tape in a three module design for tape moving in the indicated direction. The third module 306 will be referred to as the "trailing" module. The trailing module follows the middle module and is the last module seen by the tape in a three module design. The leading and trailing modules 302, 306 are referred to collectively as outer modules. Also note that the outer modules 302, 306 will alternate as leading modules, depending on the direction of travel of the tape 315.

Figure 6:
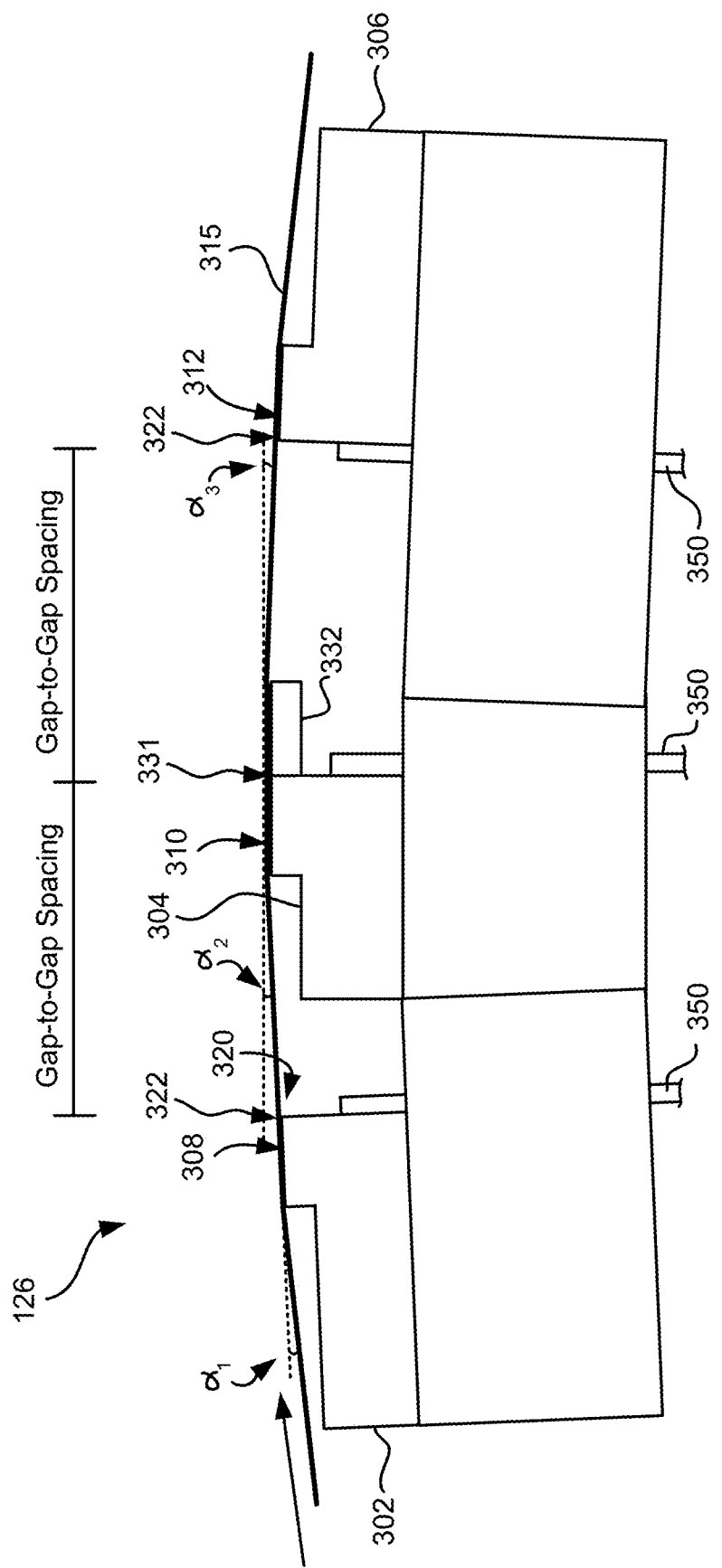
FIG. 6 is a side view of a magnetic tape head with three modules in a tangent (angled) configuration.

In one embodiment, the tape bearing surfaces 308, 310, 312 of the first, second and third modules 302, 304, 306 lie on about parallel planes (which is meant to include parallel and nearly parallel planes, e.g., between parallel and tangential as in FIG. 6), and the tape bearing surface 310 of the second module 304 is above the tape bearing surfaces 308, 312 of the first and third modules 302, 306. As described below, this has the effect of creating the desired wrap angle $\alpha_2$ of the tape relative to the tape bearing surface 310 of the second module 304.

Where the tape bearing surfaces 308, 310, 312 lie along parallel or nearly parallel yet offset planes, intuitively, the tape should peel off of the tape bearing surface 308 of the leading module 302. However, the vacuum created by the skiving edge 318 of the leading module 302 has been found by experimentation to be sufficient to keep the tape adhered to the tape bearing surface 308 of the leading module 302. The trailing edge 320 of the leading module 302 (the end from which the tape leaves the leading module 302) is the approximate reference point which defines the wrap angle $\alpha_2$ over the tape bearing surface 310 of the second module 304. The tape stays in close proximity to the tape bearing surface until close to the trailing edge 320 of the leading module 302. Accordingly, read and/or write elements 322 may be located near the trailing edges of the outer modules 302, 306. These embodiments are particularly adapted for write-read-write applications.

A benefit of this and other embodiments described herein is that, because the outer modules 302, 306 are fixed at a determined offset from the second module 304, the inner wrap angle $\alpha_2$ is fixed when the modules 302, 304, 306 are coupled together or are otherwise fixed into a head. The inner wrap angle $\alpha_2$ is approximately $\tan^{-1}$ ($\delta$/W) where $\delta$ is the height difference between the planes of the tape bearing surfaces 308, 310 and W is the width between the opposing ends of the tape bearing surfaces 308, 310. An illustrative inner wrap angle $\alpha_2$ is in a range of about 0.3° to about 1.1°, though can be any angle required by the design.

Beneficially, the inner wrap angle $\alpha_2$ on the side of the module 304 receiving the tape (leading edge) will be larger than the inner wrap angle $\alpha_3$ on the trailing edge, as the tape 315 rides above the trailing module 306. This difference is generally beneficial as a smaller $\alpha_3$ tends to oppose what has heretofore been a steeper exiting effective wrap angle.

Note that the tape bearing surfaces 308, 312 of the outer modules 302, 306 are positioned to achieve a negative wrap angle at the trailing edge 320 of the leading module 302. This is generally beneficial in helping to reduce friction due to contact with the trailing edge 320, provided that proper consideration is given to the location of the crowbar region that forms in the tape where it peels off the head. This negative wrap angle also reduces flutter and scrubbing damage to the elements on the leading module 302. Further, at the trailing module 306, the tape 315 flies over the tape bearing surface 312 so there is virtually no wear on the elements when tape is moving in this direction. Particularly, the tape 315 entrains air and so will not significantly ride on the tape bearing surface 312 of the third module 306 (some contact may occur). This is permissible, because the leading module 302 is writing while the trailing module 306 is idle.

Writing and reading functions are performed by different modules at any given time. In one embodiment, the second module 304 includes a plurality of data and optional servo readers 331 and no writers. The first and third modules 302, 306 include a plurality of writers 322 and no data readers, with the exception that the outer modules 302, 306 may include optional servo readers. The servo readers may be used to position the head during reading and/or writing operations. The servo reader(s) on each module are typically located towards the end of the array of readers or writers.

By having only readers or side by side writers and servo readers in the gap between the substrate and closure, the gap length can be substantially reduced. Typical heads have piggybacked readers and writers, where the writer is formed above each reader. A typical gap is 20-35 microns. However, irregularities on the tape may tend to droop into the gap and create gap erosion. Thus, the smaller the gap is the better. The smaller gap enabled herein exhibits fewer wear related problems.

In some embodiments, the second module 304 has a closure, while the first and third modules 302, 306 do not have a closure. Where there is no closure, preferably a hard coating is added to the module. One preferred coating is diamond-like carbon (DLC).

In the embodiment shown in FIG. 5, the first, second, and third modules 302, 304, 306 each have a closure 332, 334, 336, which extends the tape bearing surface of the associated module, thereby effectively positioning the read/write elements away from the edge of the tape bearing surface. The closure 332 on the second module 304 can be a ceramic closure of a type typically found on tape heads. The closures 334, 336 of the first and third modules 302, 306, however, may be shorter than the closure 332 of the second module 304 as measured parallel to a direction of tape travel over the respective module. This enables positioning the modules closer together. One way to produce shorter closures 334, 336 is to lap the standard ceramic closures of the second module 304 an additional amount. Another way is to plate or deposit thin film closures above the elements during thin film processing. For example, a thin film closure of a hard material such as Sendust or nickel-iron alloy (e.g., 45/55) can be formed on the module.

With reduced-thickness ceramic or thin film closures 334, 336 or no closures on the outer modules 302, 306, the write-to-read gap spacing can be reduced to less than about 1 mm, e.g., about 0.75 mm, or 50% less than commonly-used linear tape open (LTO) tape head spacing. The open space between the modules 302, 304, 306 can still be set to approximately 0.5 to 0.6 mm, which in some embodiments is ideal for stabilizing tape motion over the second module 304.

Depending on tape tension and stiffness, it may be desirable to angle the tape bearing surfaces of the outer modules relative to the tape bearing surface of the second module. FIG. 6 illustrates an embodiment where the modules 302, 304, 306 are in a tangent or nearly tangent (angled) configuration. Particularly, the tape bearing surfaces of the outer modules 302, 306 are about parallel to the tape at the desired wrap angle $\alpha_2$ of the second module 304. In other words, the planes of the tape bearing surfaces 308, 312 of the outer modules 302, 306 are oriented at about the desired wrap angle $\alpha_2$ of the tape 315 relative to the second module 304. The tape will also pop off of the trailing module 306 in this embodiment, thereby reducing wear on the elements in the trailing module 306. These embodiments are particularly useful for write-read-write applications. Additional aspects of these embodiments are similar to those given above.

Typically, the tape wrap angles may be set about midway between the embodiments shown in FIGS. 5 and 6.

Figure 7:
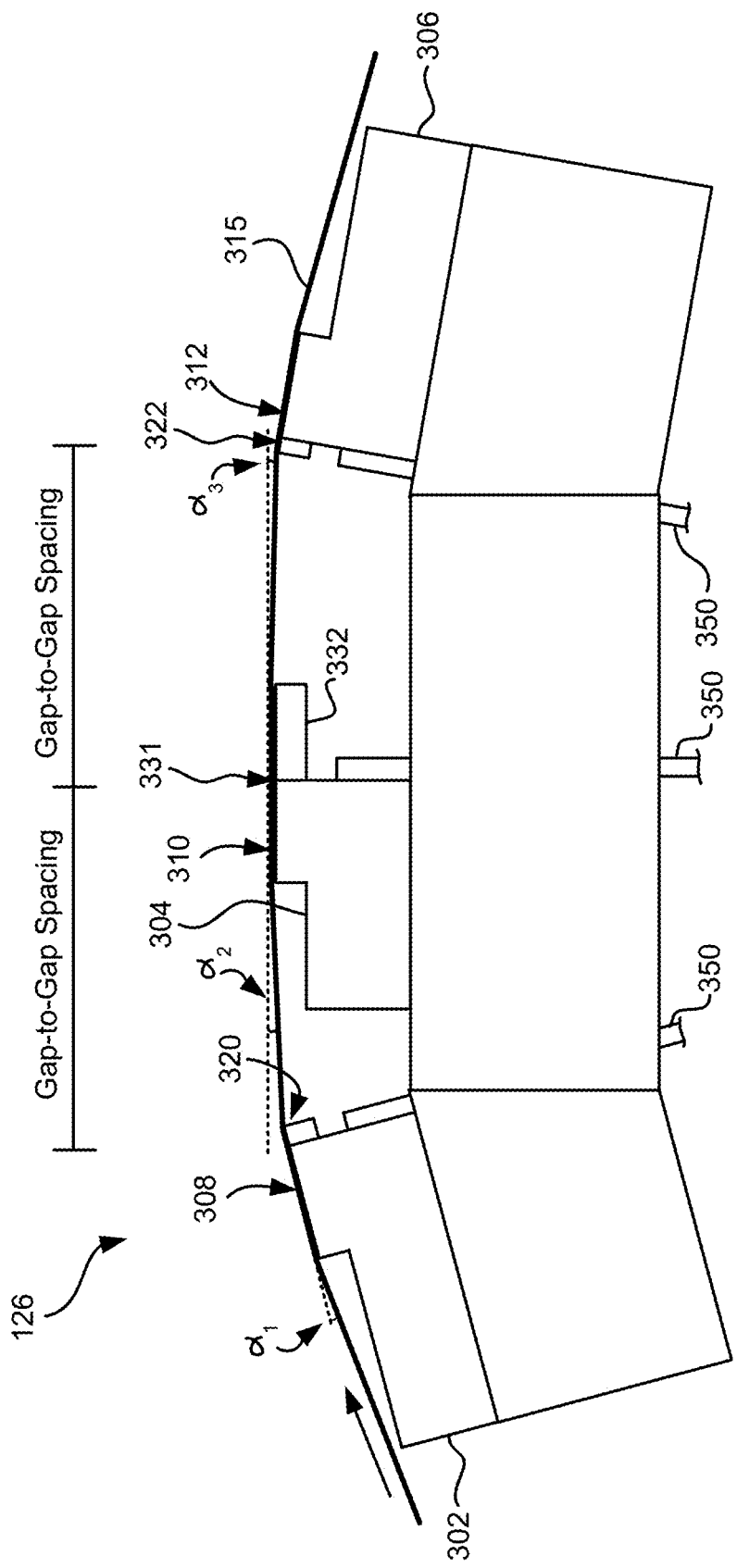
FIG. 7 is a side view of a magnetic tape head with three modules in an overwrap configuration.

FIG. 7 illustrates an embodiment where the modules 302, 304, 306 are in an overwrap configuration. Particularly, the tape bearing surfaces 308, 312 of the outer modules 302, 306 are angled slightly more than the tape 315 when set at the desired wrap angle $\alpha_2$ relative to the second module 304. In this embodiment, the tape does not pop off of the trailing module, allowing it to be used for writing or reading. Accordingly, the leading and middle modules can both perform reading and/or writing functions while the trailing module can read any just-written data. Thus, these embodiments are preferred for write-read-write, read-write-read, and write-write-read applications. In the latter embodiments, closures should be wider than the tape canopies for ensuring read capability. The wider closures may require a wider gap-to-gap separation. Therefore, a preferred embodiment has a write-read-write configuration, which may use shortened closures that thus allow closer gap-to-gap separation.

Additional aspects of the embodiments shown in FIGS. 6 and 7 are similar to those given above.

A 32 channel version of a multi-module head 126 may use cables 350 having leads on the same or smaller pitch as current 16 channel piggyback LTO modules, or alternatively the connections on the module may be organ-keyboarded for a 50% reduction in cable span. Over-under, writing pair unshielded cables may be used for the writers, which may have integrated servo readers.

The outer wrap angles $\alpha_1$ may be set in the drive, such as by guides of any type known in the art, such as adjustable rollers, slides, etc. or alternatively by outriggers, which are integral to the head. For example, rollers having an offset axis may be used to set the wrap angles. The offset axis creates an orbital arc of rotation, allowing precise alignment of the wrap angle $\alpha_1$.

To assemble any of the embodiments described above, conventional u-beam assembly can be used. Accordingly, the mass of the resultant head may be maintained or even reduced relative to heads of previous generations. In other approaches, the modules may be constructed as a unitary body. Those skilled in the art, armed with the present teachings, will appreciate that other known methods of manufacturing such heads may be adapted for use in constructing such heads. Moreover, unless otherwise specified, processes and materials of types known in the art may be adapted for use in various embodiments in conformance with the teachings herein, as would become apparent to one skilled in the art upon reading the present disclosure.

Figure 8A:
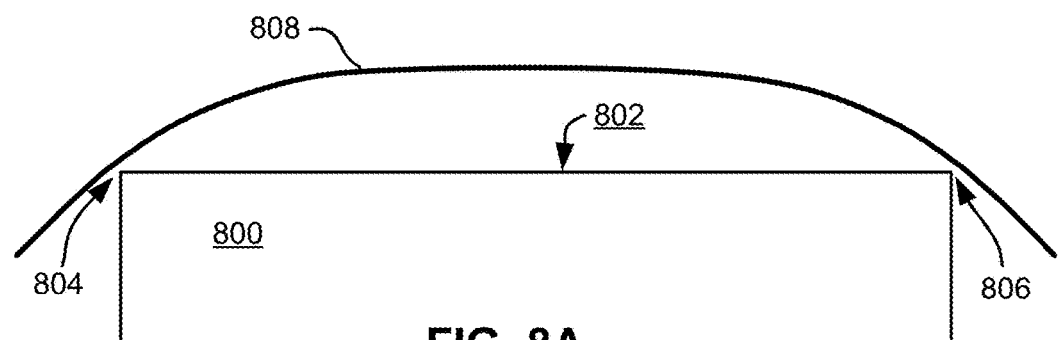
FIGS. 8A-8C are schematics depicting the principles of tape tenting.
Figure 8B:
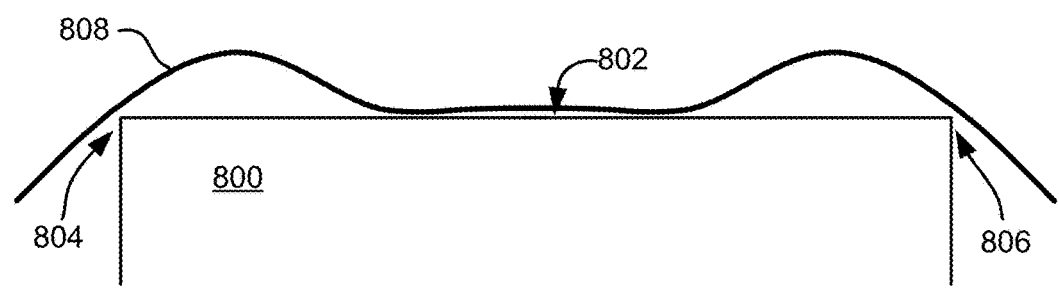
Figure 8C:
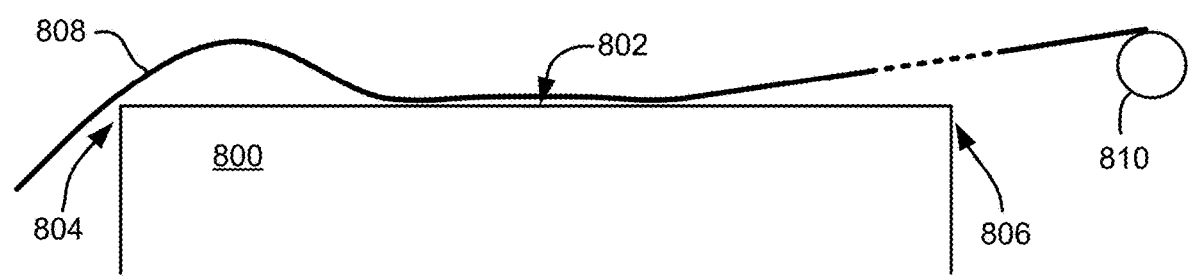

As a tape is run over a module, it is preferred that the tape passes sufficiently close to magnetic transducers on the module such that reading and/or writing is efficiently performed, e.g., with a low error rate. According to some approaches, tape tenting may be used to ensure the tape passes sufficiently close to the portion of the module having the magnetic transducers. To better understand this process, FIGS. 8A-8C illustrate the principles of tape tenting. FIG. 8A shows a module 800 having an upper tape bearing surface 802 extending between opposite edges 804, 806. A stationary tape 808 is shown wrapping around the edges 804, 806. As shown, the bending stiffness of the tape 808 lifts the tape off of the tape bearing surface 802. Tape tension tends to flatten the tape profile, as shown in FIG. 8A. Where tape tension is minimal, the curvature of the tape is more parabolic than shown.

FIG. 8B depicts the tape 808 in motion. The leading edge, i.e., the first edge the tape encounters when moving, may serve to skive air from the tape, thereby creating a subambient air pressure between the tape 808 and the tape bearing surface 802. In FIG. 8B, the leading edge is the left edge and the right edge is the trailing edge when the tape is moving left to right. As a result, atmospheric pressure above the tape urges the tape toward the tape bearing surface 802, thereby creating tape tenting proximate each of the edges. The tape bending stiffness resists the effect of the atmospheric pressure, thereby causing the tape tenting proximate both the leading and trailing edges. Modeling predicts that the two tents are very similar in shape.

FIG. 8C depicts how the subambient pressure urges the tape 808 toward the tape bearing surface 802 even when a trailing guide 810 is positioned above the plane of the tape bearing surface.

It follows that tape tenting may be used to direct the path of a tape as it passes over a module. As previously mentioned, tape tenting may be used to ensure the tape passes sufficiently close to the portion of the module having the magnetic transducers, preferably such that reading and/or writing is efficiently performed, e.g., with a low error rate.

Magnetic tapes may be stored in tape cartridges that are, in turn, stored at storage slots or the like inside a data storage library. The tape cartridges may be stored in the library such that they are accessible for physical retrieval. In addition to magnetic tapes and tape cartridges, data storage libraries may include data storage drives that store data to, and/or retrieve data from, the magnetic tapes. Moreover, tape libraries and the components included therein may implement a file system which enables access to tape and data stored on the tape.

File systems may be used to control how data is stored in, and retrieved from, memory. Thus, a file system may include the processes and data structures that an operating system uses to keep track of files in memory, e.g., the way the files are organized in memory. Linear Tape File System (LTFS) is an exemplary format of a file system that may be implemented in a given library in order to enables access to compliant tapes. It should be appreciated that various embodiments herein can be implemented with a wide range of file system formats, including for example IBM Spectrum Archive Library Edition (LTFS LE). However, to provide a context, and solely to assist the reader, some of the embodiments below may be described with reference to LTFS which is a type of file system format. This has been done by way of example only, and should not be deemed limiting on the invention defined in the claims.

A tape cartridge may be "loaded" by inserting the cartridge into the tape drive, and the tape cartridge may be "unloaded" by removing the tape cartridge from the tape drive. Once loaded in a tape drive, the tape in the cartridge may be "threaded" through the drive by physically pulling the tape (the magnetic recording portion) from the tape cartridge, and passing it above a magnetic head of a tape drive. Furthermore, the tape may be attached on a take-up reel (e.g., see 121 of FIG. 1A above) to move the tape over the magnetic head.

Once threaded in the tape drive, the tape in the cartridge may be "mounted" by reading metadata on a tape and bringing the tape into a state where the LTFS is able to use the tape as a constituent component of a file system. Moreover, in order to "unmount" a tape, metadata is preferably first written on the tape (e.g., as an index), after which the tape may be removed from the state where the LTFS is allowed to use the tape as a constituent component of a file system. Finally, to "unthread" the tape, the tape is unattached from the take-up reel and is physically placed back into the inside of a tape cartridge again. The cartridge may remain loaded in the tape drive even after the tape has been unthreaded, e.g., waiting for another read and/or write request. However, in other instances, the tape cartridge may be unloaded from the tape drive upon the tape being unthreaded, e.g., as described above.

Magnetic tape is a sequential access medium. Thus, new data is written to the tape by appending the data at the end of previously written data. It follows that when data is recorded in a tape having only one partition, metadata (e.g., allocation information) is continuously appended to an end of the previously written data as it frequently updates and is accordingly rewritten to tape. As a result, the rearmost information is read when a tape is first mounted in order to access the most recent copy of the metadata corresponding to the tape. However, this introduces a considerable amount of delay in the process of mounting a given tape.

To overcome this delay caused by single partition tape mediums, the LTFS format includes a tape that is divided into two partitions, which include an index partition and a data partition. The index partition may be configured to record metadata (meta information), e.g., such as file allocation information (Index), while the data partition may be configured to record the body of the data, e.g., the data itself.

Figure 9:
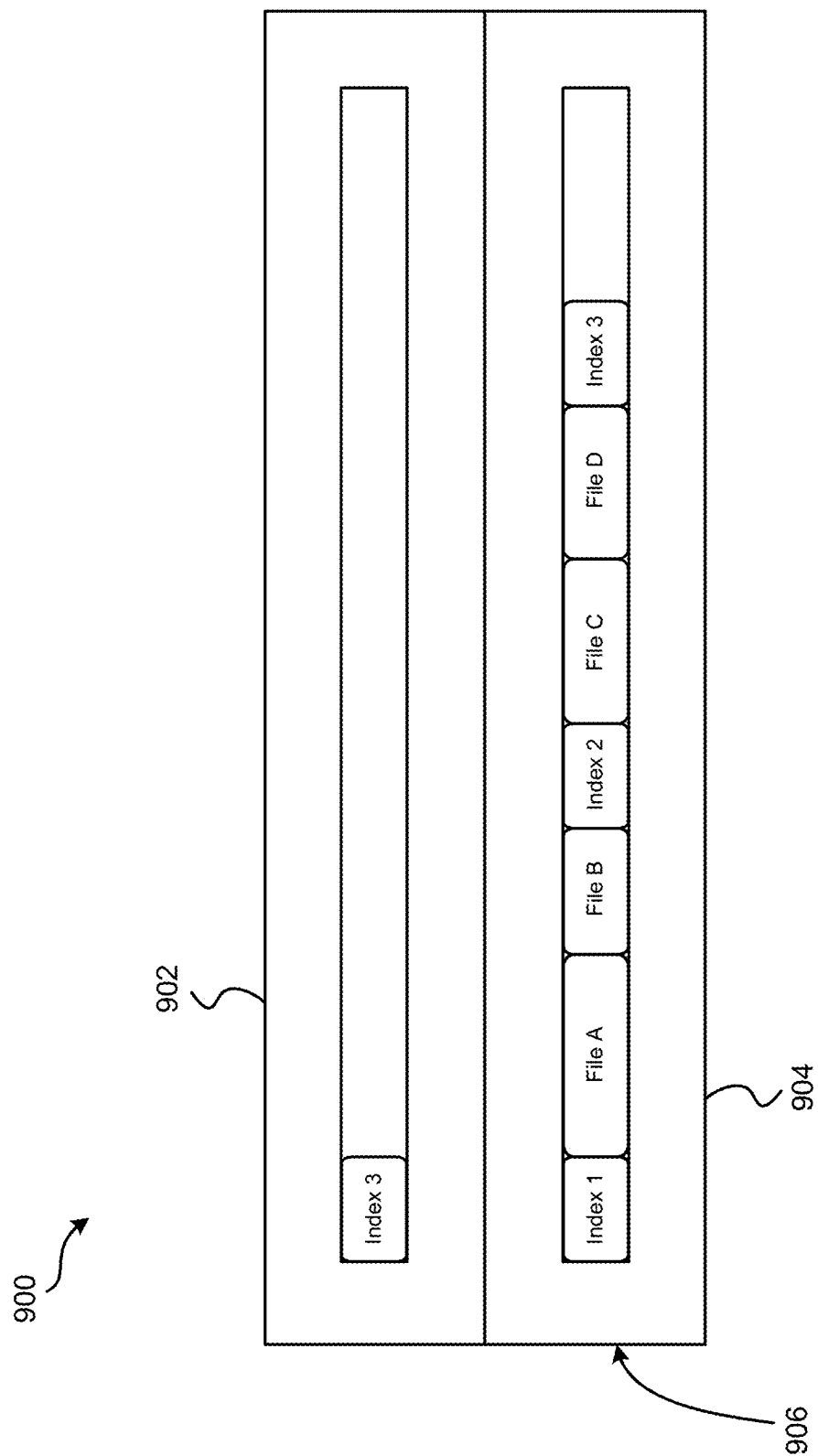
FIG. 9 is a representational diagram of files and indexes stored on a magnetic tape according to one embodiment.

Looking to FIG. 9, a magnetic tape 900 having an index partition 902 and a data partition 904 is illustrated according to one embodiment. As shown, data files and indexes are stored on the tape. The LTFS format allows for index information to be recorded in the index partition 902 at the beginning of tape 906, as would be appreciated by one skilled in the art upon reading the present description.

As index information is updated, it preferably overwrites the previous version of the index information, thereby allowing the currently updated index information to be accessible at the beginning of tape in the index partition. According to the specific example illustrated in FIG. 9, a most recent version of metadata Index 3 is recorded in the index partition 902 at the beginning of the tape 906. Conversely, all three version of metadata Index 1, Index 2, Index 3 as well as data File A, File B, File C, File D are recorded in the data partition 904 of the tape. Although Index 1 and Index 2 are old (e.g., outdated) indexes, because information is written to tape by appending it to the end of the previously written data as described above, these old indexes Index 1, Index 2 remain stored on the tape 900 in the data partition 904 without being overwritten.

The metadata may be updated in the index partition 902 and/or the data partition 904 the same or differently depending on the desired embodiment. According to some embodiments, the metadata of the index and/or data partitions 902, 904 may be updated in response to the tape being unmounted, e.g., such that the index may be read quickly from the index partition when that tape is mounted again. The metadata is preferably also written in the data partition 904 so the tape may be mounted using the metadata recorded in the data partition 904, e.g., as a backup option.

According to one example, which is no way intended to limit the invention, LTFS LE may be used to provide the functionality of writing an index in the data partition when a user explicitly instructs the system to do so, or at a time designated by a predetermined period which may be set by the user, e.g., such that data loss in the event of sudden power stoppage can be mitigated.

A problem discovered in thin film devices including magnetic recording heads is unanticipated variation in spacing between features. Such variations may lead to various problems depending on the application. In an exemplary example, nanometer scale variation of the pitch between transducers in a multichannel magnetic recording head die, or difference in said pitch among multiple dies, may place limits on achievable recording areal density gains. This because the variation may result in having to increase the width of shingle writing tracks to accommodate write appending with heads having different transducer pitches, and wider tracks means lower tracks per inch (tpi). In addition, misregistration between recorded data and read head transducers that vary in pitch places an upper bound on reader width for a given track density and thus impacts achievable SNR.

Pitch variations and differences may be related to stress imbalances within the thin films themselves, perhaps arising from annealing or other processes performed on the wafers containing the head dies, and/or perhaps from mechanical and/or other post wafer processing steps used for fabricating recording head dies.

Regardless of the source of variation, there is a need for ascertaining the spans/pitches of said features. In various embodiments described herein, a span of distance between features on a sample may be determined to an accuracy of ±10 nanometers (nm) or better. Moreover, the features as described herein, enable performing precise measurement of a span between features either at the wafer level, or on finished dies, or at intermediate points of processing (wafer level, lapped surface level, finished die level, etc. Exemplary features may be portions of a thin film die (e.g. a magnetic recording die), or an entire, functional thin film device. Moreover, as described more fully below, the features may be dedicated structures of the thin film die, such that a dedicated structure is used for no other purpose.

According to various embodiments described herein, precise measurements of transducer locations at various steps during head die processing may be performed for one of the following outcomes, or for a combination of the following outcomes: a) diagnosing root cause of the misregistration of the transducers after processing, b) calibrating the deviation from the defined distance of the span between transducers, c) screening fabricated dies to a specification, and d) controlling the use of the head having a deviation between transducers. Precision measurements on the order of 10 nanometers or better are desired for features that may have a distance span of up to several millimeters between each feature.

Various embodiments described herein solve a problem of accurately measuring span of transducers and other portions in a multichannel recording head die.

Figure 10:
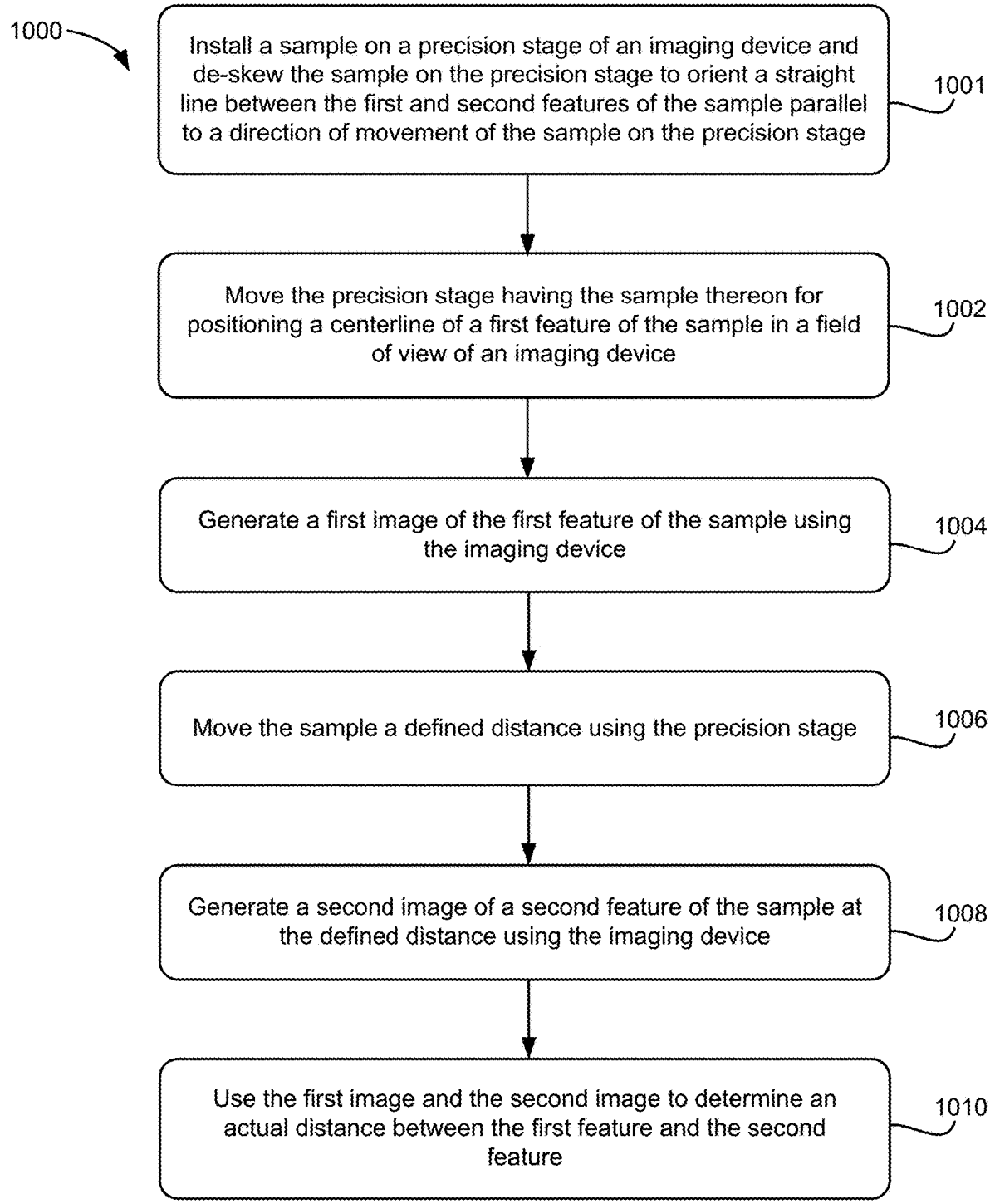
FIG. 10 is a flow diagram of a method for measuring a distance between at least two features of a sample, in accordance with one embodiment.

FIG. 10 shows a method 1000 for measuring a distance between at least two features of a sample, in accordance with one embodiment. As an option, the present method 1000 may be implemented to construct structures such as those shown in the other FIGS. described herein. Of course, however, this method 1000 and others presented herein may be used to provide applications which may or may not be related to the illustrative embodiments listed herein. Further, the methods presented herein may be carried out in any desired environment. Moreover, more or less operations than those shown in FIG. 10 may be included in method 1000, according to various embodiments. It should also be noted that any of the aforementioned features may be used in any of the embodiments described in accordance with the various methods.

Method 1000 may include an initial operation 1001 of installing a sample on a precision stage of an imaging device and de-skewing the sample on the precision stage to orient a straight line between the first and second features of the sample parallel to a direction of movement of the sample on the precision stage.

The method 1000 includes an operation 1002 of moving a precision stage having the sample thereon for positioning a reference line of a first feature of the sample in a field of view of an imaging device, e.g., using a coarse stage of the imaging device. The field of view defines the area of the sample that is imaged. The area to be imaged may be referred to as an imaging area, scanning region, imaging region, etc. In some approaches, the sample may be a wafer having a plurality of thin films. In other approaches, the sample may be a section of a wafer having a plurality of thin films, including a die section. In an exemplary approach, the sample may be a thin film structure having a lapped surface. In yet other approaches, the sample may be a section of a magnetic die. The features are detectable on an exposed surface of the thin film structure. For example, the exposed surface may be the upper surface of the wafer in a wafer view (top down view of the wafer surface). The exposed surface may be a lapped surface of the thin film structure in a plane view (view of the wafer profile and/or lapped surface).

Moreover, in an exemplary approach, the coarse stage may be a translation stage on an atomic force microscope (AFM). The precision stage translates the sample distances corresponding to distance between features to an accuracy of ±10 nm or better.

In various approaches to the method 1000, the imaging device may be one of the following: atomic force microscope (AFM), magnetic force microscope (MFM), magnetic resistive scanning microscope, electrostatic force microscopy (EFM), thermal imaging microscope, scanning electron microscope (SEM), an ultraviolet microscope, or an optical microscope.

Figure 11:
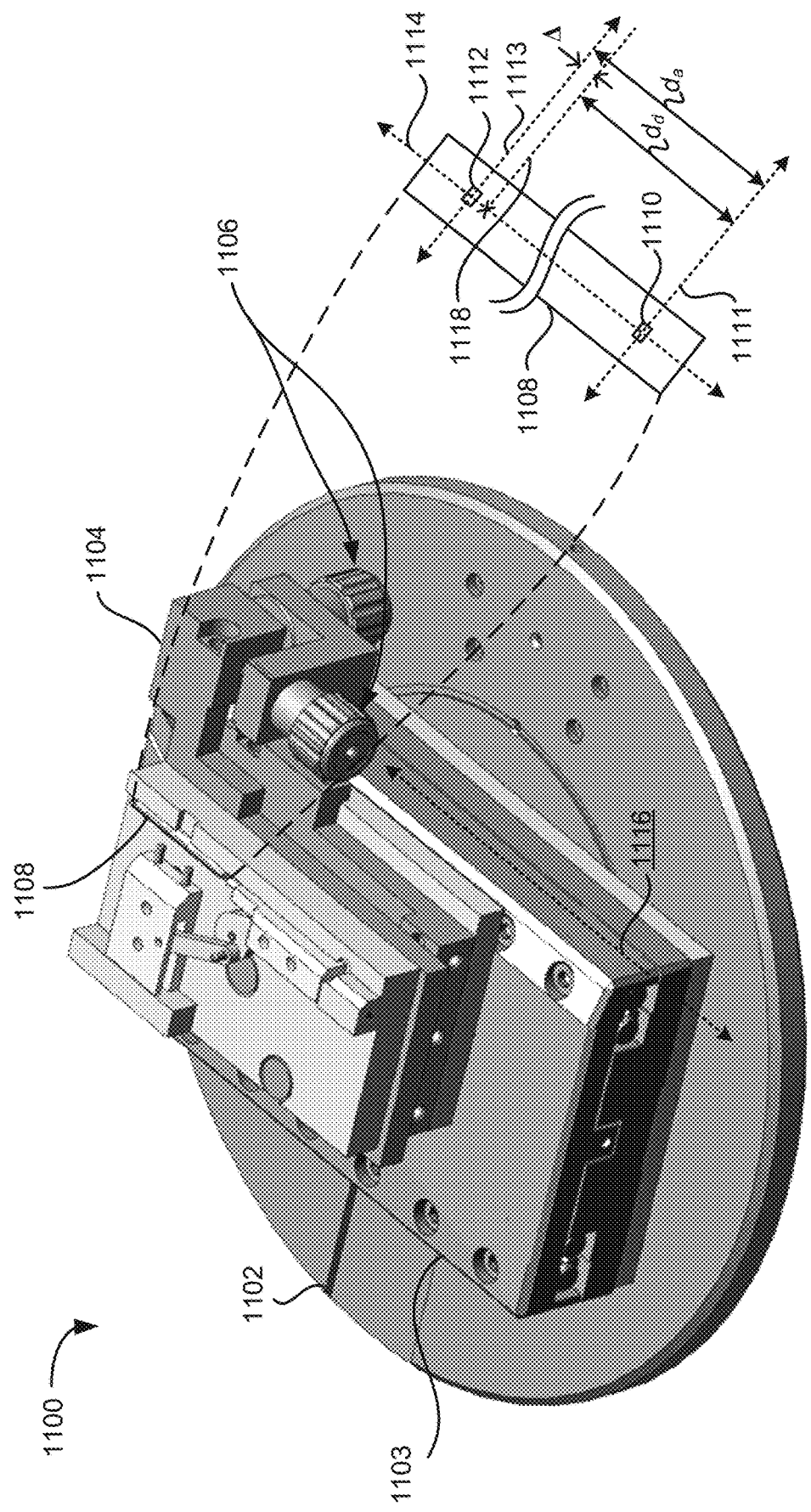
FIG. 11 is a drawing of an example of a precision stage.

In some approaches, a precision stage may be attached to the coarse stage of the imaging device. FIG. 11 shows a drawing of an example of a precision stage, but this illustration is for example only and is not meant to be limiting. As shown in FIG. 11, the precision stage 1103 is placed on, and preferably coupled to, the coarse stage 1102 of imaging device 1100. Any conventional commercially available precision stage may be used for method 1000, as would be understood by one skilled in the art. As illustrated in FIG. 11, the precision stage 1103 may be a Physik Instrumente PI-565 Linear Positioner from Physik Instrumente (PI) GmbH & Co. KG, having a place of business at Auf der Roemerstrasse 1, 76228 Karlsruhe, Germany. The precision stage may be attached to a coarse stage 1102 of the imaging device 1100 to facilitate the measurements described herein. In an exemplary approach, the precision stage of the imaging device includes an interferometer such that moving the sample the defined distance using the precision stage is performed using readings from the interferometer. In some approaches, the interferometer may be a Mach-Zehnder interferometer to enable nanometer precision, as would be understood by one skilled in the art.

In some approaches, as illustrated in inset of FIG. 11, positioning a sample 1108 on the precision stage 1103 before generating a first image of the first feature 1110 of the sample 1108 may include de-skewing the sample 1108. In an exemplary approach, a sample may be de-skewed to avoid introducing measurement errors that may be caused by in-plane and out-of-plane rotation. The de-skewing may be performed on separate stages, as would be known by one skilled in the art. For example, in some approaches as shown in FIG. 11, a positioning apparatus 1104 may be attached to the precision stage 1103. A positioning apparatus may be a commercially available stage or a stage engineered for de-skewing purposes as would be understood by one skilled in the art. The de-skewing may include adjusting, e.g. moving the adjustment knobs 1106 of a positioning apparatus 1104, a position of the sample 1108 on the precision stage 1103 to orient an imaginary straight line 1114 between the first and second features 1110, 1112 of the sample 1108 parallel to a direction 1116 of movement of the sample 1108 on the precision stage 1103.

In addition, in some approaches, method 1000 may include either controlling or correcting for thermal drift of the sample before generating the first image of the first feature using conventional techniques as would be understood by one skilled in the art.

Looking back to FIG. 10, in operation 1004 of method 1000, the imaging device is instructed to generate a first image of the first feature of the sample. Note that if the imaging device is programmed to perform the method 1000, it may instruct itself. In a preferred approach, the first feature is imaged in an AFM at a relatively high magnification, e.g. 3000 nm×3000 nm or 1000 nm×1000 nm. An image may be 1024×1024 or 512×512 pixels (or more or less), as would be understood by one skilled in the art. In some approaches, more pixels may provide more resolution but may increase the time for measurement and be more susceptible to thermal or other drift.

In the first image, a reference line of the feature may be derived. As simply drawn in the inset of FIG. 11, a reference line 1111 of the first feature 1110 is derived in the first image.

Operation 1006 includes moving the sample a defined distance using the precision stage. As illustrated in FIG. 11, the precision stage 1103 may move the sample 1108 a defined distance $d_d$ from the first feature 1110 towards the second feature 1112.

In operation 1008 of method 1000, the imaging device is instructed to generate a second image of a second feature of the sample at the defined distance. Note that if the imaging device is programmed to perform the method 1000, it may instruct itself. As shown in FIG. 11, the imaging device 1100 may generate an image of the second feature 1112 at the defined distance $d_d$. From the second image generated at the second feature 1112, a reference line 1118 at a defined distance $d_d$ may be derived. The reference line 1118 at the defined distance $d_d$ from the first feature 1110 may not be located in the same position as the reference line 1113 of the second feature 1112. In some approaches, the distance between the features may have changed since fabrication of the thin films (e.g. during post-processing), the defined distance $d_d$ to the second feature 1112 may not be accurate, and rather, be a distance between the first feature 1110 and an arbitrary location X having a reference line 1118. Note, FIG. 11 is not drawn to scale and thus distances between features 1110, 1112 are drawn for explanation only.

Operation 1010 of method 1000 includes using (e.g., comparing) the first image and the second image to determine an actual distance between a reference line of the first feature on the first image and a reference line of the second feature on the second image. In some approaches, two features of the sample may be features for determining a defined span of distance on the sample. In one approach, as illustrated in the inset of FIG. 11, the method 1000 may determine an actual distance $d_a$ between a reference line 1111 of the first feature 1110 and a reference line 1113 of the second feature 1112.

In some approaches, actual distance $d_a$ may be defined as a defined distance $d_d$ adjusted by a deviation $\Delta$, where the deviation $\Delta$ is a difference between the defined distance $d_d$ and the actual distance $d_a$ measured between a reference line 1113 of the second feature 1112 shown on the second image and the reference line 1111 of the first feature 1110 shown on the first image. Moreover, the difference in reference line locations 1118, 1113 of the first and second images is the span deviation $\Delta$.

In some approaches of method 1000, the at least two features 1110, 1112 may be dedicated for enabling measurement therebetween, i.e., not used for any other purpose.

In some approaches, after operation 1010, method 1000 may include moving the sample from the second feature to the first feature the actual distance using the precision stage. In one approach, the stage may be reset to move exactly the actual distance $d_a$ from the second feature 1112 to the first feature 1110 to confirm the distance of the span between the two features. Furthermore, using the second image and the first image may confirm the actual distance $d_a$ between the reference line 1111 of the first feature 1110 on the first image and the reference line 1113 of the second feature 1112 on the second image.

In some approaches, method 1000 may include returning to the first feature and re-imaging the first feature to determine if thermal or other drift may have occurred. Measurements may be repeated accordingly. For example, method 1000 may include generating a third image after the sample is moved from the second feature back to the first feature. The second image and the third image may then be used to determine a second actual distance between the first feature and the second feature. The actual distance and the second actual distance may be used to verify the actual distance calculated in the first operation. The measuring procedure may be repeated in response to determining the actual distance is different than the second actual distance by no more than the known repeatability of the precision stage e.g., as defined in its specification, based on testing, etc.

In further approaches, two precision stages may be used to enable measurements in the x-y plane. For example, one precision stage may be placed on top of another precision stage orthogonally, and both precision stages used to measure and/or map in both x and y directions. This enables mapping of a servo pattern, e.g., on tape, using an ARM. This enables mapping out the actual shape of the servo pattern very accurately.

Figure 12:
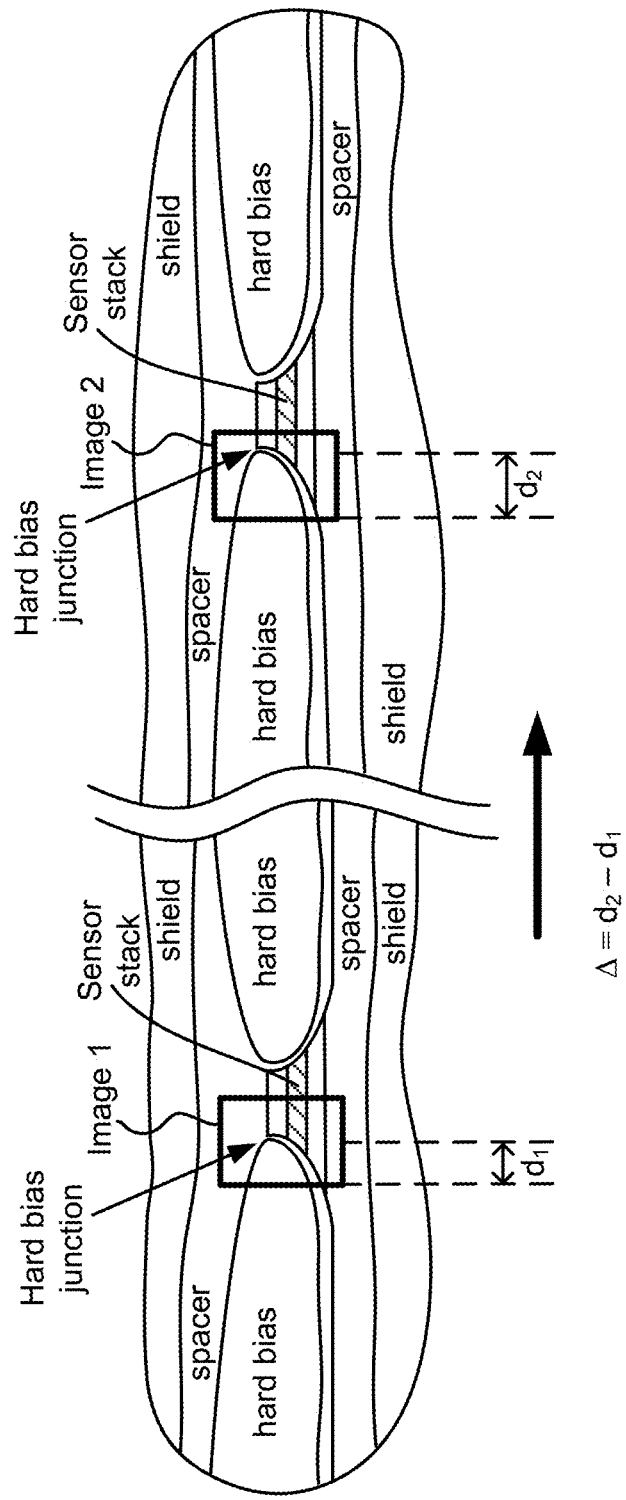
FIG. 12 is a partial side view depicting an example of using existing features of a thin film structure for determining a deviation between the features.

In some approaches of method 1000, existing features of a thin film structure may be used in combination with or in addition to the dedicated features 1110, 1112. FIG. 12 illustrates an example (not meant to be limiting in any way) of using existing features of a thin film structure for determining a deviation between the features. FIG. 12 is a schematic drawing of a plane view of a hard bias junction of a TMR read transducer in a multichannel recording head die. The method as described herein may be used to determine a span deviation by measuring the distance between writer servo 1 and writer servo 2. In particular, as shown in FIG. 12, spans between hard bias junctions of servo readers may be a direct measurement of the magnetic spans. In some approaches using LTO heads, the transducer span is expected to be 2859 microns ($\mu$m). The sample may then be moved a defined distance in the direction of the arrow (as shown in FIG. 12) toward the second feature, or as illustrated, servo reader.

As described for operation 1008 of method 1000 (see FIG. 10), an image may then be generated of writer servo 2. Preferably, the same field of view is used for generating an image of writer servo 2 that includes the hard bias junction.

Alternatively, dedicated features may be used to determine uniformity of expansion and/or contraction over a greater length than the transducer span. Hard bias junctions and/or trackwidths of AMR, GMR, or TMR transducers may be used in various approaches of method 1000. In some approaches, servo readers in writer modules may be used as non-dedicated features. In other approaches, write transducers may be used as non-dedicated features. In yet other approaches, dedicated features as described herein may be located within an existing array of data transducers and thereby may provide greater precision in determining span variation.

In some approaches, the method 1000 may include measuring an in-plane bow of the magnetic recording die media bearing surface. In some approaches, the precision stage may be moved to a predetermined location that may or may not have dedicated features and/or magnetic recording elements having identifiable features. For the purposes of these embodiments, an in-plane bow may be defined as the deviation of a planar surface, such as the planar surface of the wafer die, visible at the media bearing surface relative to the straight line of precision stage motion.

In some approaches, the computation of the distance between two features may include adjusting the predefined distance with a misregistration, for example, as determined from the comparison of the first image of the first feature with the second image of the second feature. In some approaches, the misregistration may be between sample feature locations in the first image and the second image.

In some approaches, the misregistration between two images may be determined based on pixel displacement. For example, the images may be overlaid one atop the other, and the pixels between the features of interest may be counted and correlated to distance. In some approaches, the counting may be done manually by a human viewing overlaid images. In other approaches, the two images may be compared using image processing software that may provide computations by image subtraction or other conventional technique to determine the pixel displacement between features of interest in the two images.

FIGS. 13A-13D depicts various embodiments of a product 1300 having features that enable measuring of the span between features. As an option, the present product 1300 may be implemented in conjunction with features from any other embodiment listed herein, such as those described with reference to the other FIGS. Of course, however, such product 1300 and others presented herein may be used in various applications and/or in permutations which may or may not be specifically described in the illustrative embodiments listed herein. Further, the product 1300 presented herein may be used in any desired environment.

According to one embodiment, the product includes a thin film structure having a plurality of elements, which may be exposed on the surface of the thin film structure being viewed, embedded, or a combination of both. FIG. 13A is a plane view of a lapped surface 1320 of a thin film structure 1322. In some approaches, the product 1300 may have a plurality of elements 1310 exposed on the lapped surface 1320 of the thin film structure 1322. In an exemplary embodiment, the thin film structure is a magnetic head die, wherein the elements are servo readers, each feature being positioned at a known position relative to a respective one of the servo readers.

In one embodiment, the product may include at least two features dedicated for enabling measurement therebetween, i.e., the features are not used for any other mechanical or electrical purpose in the final product. As shown in FIG. 13A, the product 1300 may have a plurality of features 1302a, 1302b, 1302c, 1302d, 1302e exposed on the lapped surface 1320 of the thin film structure 1322. In some approaches, the dedicated features 1302a, 1302b, 1302c, 1302d, 1302e may have narrow and thin rectangular shapes at precise locations.

In one embodiment, dedicated features at precise locations in the thin film structure may be used for plane view measurements, e.g., ends of the features are on an exposed surface of the thin film structure. In some approaches, the plane view measurements using dedicated features may be used after the thin film fabrication processing and dicing of the recording head wafers but before assembly into the head module.

In some approaches, the features may be spaced at predetermined intervals within the thin film structure (e.g. die). In some approaches, these features 1302a, 1302b, 1302c, 1302d, 1302e may be dedicated for enabling measurement of the span of distance d therebetween the features 1302a, 1302b, 1302c, 1302d, 1302e. In some approaches, the features 1302a, 1302b, 1302c, 1302d, 1302e may not be used for any other purpose.

In some approaches, the ends of the features may be exposed on the lapped surface, as shown in FIG. 13A. Moreover, each feature, for example features 1302d, 1302e, may be positioned at a known position relative to a respective one of the elements 1310, thereby allowing indirect measurement of the distance between elements.

In various approaches, e.g., as shown in FIG. 13A, the features may be narrow so as to fit in a field of view 1304 of an imaging device.

FIG. 13B illustrates a top down view (wafer view) of a plurality of features deposited on a plurality of thin films 1322 of a wafer 1308. In some approaches, each feature, for example, feature 1302d as shown in magnified view of circle 13D (FIG. 13D), may have a width w in a range of about 50 nm to about 2000 nm. In some approaches, a length l (also called stripe height) of each feature, for example feature 1302d in FIG. 13D, may be at least twice as long as the width w. In some approaches, the wafer view measurements using dedicated features may be used at one or more stages in the thin film fabrication processing of the recording head wafers.

FIG. 13C represents features 1302a, 1302b following cutting along line 13C in FIG. 13B. In various approaches, as shown in FIG. 13C, the features 1302a, 1302b may extend to the tape bearing surface 1324 and, thus, may be lapped and polished. In some approaches, the plated features 1302a, 1302b may be differentially etched to create a non-planar surface for AFM imaging.

In various embodiments, including the products 1300 of FIGS. 13A-13D and products 1400 of FIGS. 14A-14C, and others described herein, the dedicated features in a thin film structure (e.g. magnetic recording head die) may include plated films, sputtered features, and/or other structures formed on or in the thin film structure by conventional deposition techniques. Conventional photolithography may be used in conjunction with any deposition technique, as would be understood by one skilled in the art upon reading the present disclosure. In some approaches, each feature may be formed concurrently with elements of the thin film structures.

In a preferred embodiment, the features are thin. For example, a deposition thickness of each feature may be in a range of about 25 nanometers (nm) to about 250 nm. Deposition of a thin feature may facilitate imaging in an AFM either immediately after forming the feature or at least prior to subsequent processing that may planarize the surface (as illustrated in FIGS. 13A and 13C). Thin features are more preferably used for the wafer view, as thin features are harder to image than thicker features in the plane view (lapped surface view). A low thickness is better for imaging in wafer view than thick features. Moreover, thin features can be more easily planarized on the wafer. The double bar feature of FIGS. 14A-14C can also have a low thickness.

For plane view measurements, thicker bars are more preferred, as they are easier to image. In various approaches, a deposition thickness of each bar is in a range of about 250 nanometers to about 3000 nanometers.

Combinations of thicker and relatively thinner, and/or wider and relatively narrower features, may be present in a single product.

In preferred approaches, the features may have a width w in a range of about 50 nm to about 2000 nm wide, and a deposition thickness in a range of about 500 nm to about 2000 nm.

In some approaches, the features may be patterned regions of a material used for defining critical features of the thin film structure. For example, but not meant to be limiting, cobalt platinum hard bias magnet material may be used to form the features. Hard bias magnet films may be 60 to 80 nm thick and thus easily profiled in an atomic force microscope (AFM). In some approaches, the features may be profiled in a scanning electron microscope (SEM) during scanning of the die wafer surface. In the top down view of FIG. 13B, the field of view 1304 of the imaging device may include the portion of the feature that includes the reference line 1306, e.g., the centerline, of the feature.

In some approaches, the features of the thin film structure may include suitable material well known by one skilled in the art. For example, illustrative materials may include a combination of nickel and iron, an alloy of nickel and iron, permalloy, a combination of nickel and chromium, an alloy of nickel and chromium (e.g. nichrome), etc. The lapped media bearing surface may typically not be perfectly planar, e.g. permalloy features may protrude above or be recessed from the surrounding material, which may be alumina, to facilitate imaging. In some approaches, devices may be etched to accentuate the surface profile height differences for optimized imaging.

In some approaches, regions patterned by photolithography may be used for electroplating thicker features at locations that may be determined by critical film features. Thicker features may be imaged for determining location thereof by scanning the tape bearing surface using an AFM. In so doing, the dedicated feature is preferably distinguished by its topography (as shown in FIG. 13C) relative to the proximate materials in the die.

FIGS. 14A-14C depict a product 1400 having dedicated features for enabling measurement of a span between the features, in accordance with various embodiments. As an option, the present product 1400 may be implemented in conjunction with features from any other embodiment listed herein, such as those described with reference to the other FIGS. Of course, however, such product 1400 and others presented herein may be used in various applications and/or in permutations which may or may not be specifically described in the illustrative embodiments listed herein. Further, the product 1400 presented herein may be used in any desired environment.

In one embodiment, a product 1400 may include a thin film structure having a plurality of elements exposed on a lapped surface of the thin film structure and at least two features dedicated for enabling measurement therebetween where each feature may include two bars preferably aligned parallel to each other and a space defined therebetween. FIG. 14A is a schematic drawing of a lapped surface 1420 of a thin film structure 1422 prior to fabricating the structure into a module. As shown in FIG. 14A, the product 1400 may have a plurality of features 1402a, 1402b, 1402c, 1402d, 1402e exposed on a lapped surface 1420 of the thin film structure 1422. Looking to feature 1402c, a feature 1402c may have two rectangle bars 1405, 1406 preferably aligned parallel to each other and a space 1404 defined therebetween. In addition, a reference line 1306 may be centered in the space 1404 between the two rectangle bars 1405, 1406 of the feature 1402c.

In some approaches, the space 1404 may have a width in a range of about 250 nanometers to about 3000 nanometers. Furthermore, the space 1404 may have a reference line 1306 oriented perpendicular to the lapped surface 1420. The width and/or thickness of the bars 1405, 1406 may be similar or the same to the widths and thicknesses described elsewhere herein.

In one embodiment, a feature having two bars aligned parallel to each other with a space therebetween allows for the two bars, e.g. rectangle bars, to be larger than the features 1302a-e in FIGS. 13A-D, and thereby may facilitate processing. For instance, the two rectangle bars 1405, 1406 of feature 1402c may be large, i.e., larger than desired for imaging, the space 1404 therebetween is as small and narrow as each feature e.g. feature 1302c, formed in product 1300 (see FIGS. 13A and 13B). Thus, the reference line 1306 centered in the space 1404, where the space may be 250 nm to 3000 nm wide, results in greater precision in the image generated from the feature in the field of view 1304 of the imaging device (as illustrated in both in lapped surface view FIG. 14A and top down wafer view FIG. 14B).

FIG. 14C represents features 1402a, 1402b following deposition when the wafer 1408 and thin films 1422 are cut along 14C in FIG. 14B. In various approaches, as shown in FIG. 14C, the plated features 1402a, 1402b may extend to the tape bearing surface 1424 and, thus may be lapped and polished. In some approaches, the plated features 1402a, 1402b may be differentially etched to create a non-planar surface for AFM imaging. In preferred approaches, the features 1402a, 1402b may have a width w in a range of about 500 nm to about 2000 nm wide, and a deposition thickness in a range of about 500 nm to about 2000 nm.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a ROM, an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method for measuring a distance between features of a sample, the method comprising:
   moving a precision stage having the sample thereon for positioning a first feature of the sample in a field of view of an imaging device, wherein the precision stage of the imaging device includes an interferometer;
   instructing the imaging device to generate a first image of the first feature of the sample;
   moving the sample a defined distance using the precision stage, wherein moving the sample the defined distance is performed using readings from the interferometer;
   instructing the imaging device to generate a second image of a second feature of the sample at the defined distance; and
   using the first image and the second image to determine an actual distance between the first feature and the second feature.

2. The method as recited in claim 1, comprising:
   moving the sample from the second feature to the first feature the actual distance using the precision stage;
   generating a third image of the first feature upon the sample being moved from the second feature to the first feature;
   using the second image and the third image to determine a second actual distance between the first feature and the second feature; and
   comparing the actual distance and the second actual distance for verifying the actual distance.

3. The method as recited in claim 1, wherein the imaging device is selected from the group consisting of: atomic force microscope, magnetic force microscope, magnetic resistive scanning microscope, electrostatic force microscopy, thermal imaging microscope, scanning electron microscope, an ultraviolet microscope, and an optical microscope.

4. The method as recited in claim 1, wherein the features of the sample are features for determining a defined span of distance on the sample.

5. The method as recited in claim 1, wherein the features are dedicated for enabling measurement therebetween.

6. The method as recited in claim 1, wherein the sample includes a thin film structure, wherein the features are detectable on an exposed surface of the thin film structure.

7. The method as recited in claim 6, wherein the exposed surface is a lapped surface of the thin film structure.

8. The method as recited in claim 1, comprising de-skewing the sample on the precision stage before generating the first image of the first feature, wherein the de-skewing comprises:

adjusting a position of the sample on the precision stage to orient a straight line between the first and second features of the sample parallel to a direction of movement of the sample on the precision stage.

9. The method as recited in claim 1, comprising correcting for thermal drift of the sample before generating the first image of the first feature.

10. A method for measuring a distance between features of a sample, the method comprising:
   moving a precision stage having the sample thereon for positioning a first feature of the sample in a field of view of an imaging device;
   instructing the imaging device to generate a first image of the first feature of the sample;
   moving the sample a defined distance using the precision stage;
   instructing the imaging device to generate a second image of a second feature of the sample at the defined distance;
   using the first image and the second image to determine an actual distance between the first feature and the second feature;
   moving the sample from the second feature to the first feature the actual distance using the precision stage;
   generating a third image of the first feature upon the sample being moved from the second feature to the first feature;
   using the second image and the third image to determine a second actual distance between the first feature and the second feature; and
   comparing the actual distance and the second actual distance for verifying the actual distance.

11. The method as recited in claim 10, wherein the imaging device is selected from the group consisting of: atomic force microscope, magnetic force microscope, magnetic resistive scanning microscope, electrostatic force microscopy, thermal imaging microscope, scanning electron microscope, an ultraviolet microscope, and an optical microscope.

12. The method as recited in claim 10, wherein the precision stage of the imaging device includes an interferometer, wherein moving the sample the defined distance using the precision stage is performed using readings from the interferometer.

13. The method as recited in claim 10, wherein the features of the sample are features for determining a defined span of distance on the sample.

14. The method as recited in claim 10, wherein the features are dedicated for enabling measurement therebetween.

15. A method for measuring a distance between features of a sample, the method comprising:
   moving a precision stage having the sample thereon for positioning a first feature of the sample in a field of view of an imaging device;
   de-skewing the sample on the precision stage, wherein the de-skewing comprises:
      adjusting a position of the sample on the precision stage to orient a straight line between the first and second features of the sample parallel to a direction of movement of the sample on the precision stage;
   instructing the imaging device to generate a first image of the first feature of the sample;
   moving the sample a defined distance using the precision stage;
   instructing the imaging device to generate a second image of a second feature of the sample at the defined distance; and
   using the first image and the second image to determine an actual distance between the first feature and the second feature.

16. The method as recited in claim 15, comprising:
   moving the sample from the second feature to the first feature the actual distance using the precision stage;
   generating a third image of the first feature upon the sample being moved from the second feature to the first feature;
   using the second image and the third image to determine a second actual distance between the first feature and the second feature; and
   comparing the actual distance and the second actual distance for verifying the actual distance.

17. The method as recited in claim 15, wherein the imaging device is selected from the group consisting of: atomic force microscope, magnetic force microscope, magnetic resistive scanning microscope, electrostatic force microscopy, thermal imaging microscope, scanning electron microscope, an ultraviolet microscope, and an optical microscope.

18. The method as recited in claim 15, wherein the precision stage of the imaging device includes an interferometer, wherein moving the sample the defined distance using the precision stage is performed using readings from the interferometer.

19. The method as recited in claim 15, wherein the features of the sample are features for determining a defined span of distance on the sample.

* * * * *